United States Patent
Ogura et al.

(10) Patent No.: US 10,468,511 B2
(45) Date of Patent: Nov. 5, 2019

(54) SEMICONDUCTOR DEVICE

(71) Applicant: KABUSHIKI KAISHA TOSHIBA, Minato-ku, Tokyo (JP)

(72) Inventors: Tsuneo Ogura, Kanagawa (JP); Tomoko Matsudai, Tokyo (JP)

(73) Assignee: KABUSHIKI KAISHA TOSHIBA (JP)

( * ) Notice: Subject to any disclaimer, the term of this patent is extended or adjusted under 35 U.S.C. 154(b) by 7 days.

(21) Appl. No.: 15/441,485

(22) Filed: Feb. 24, 2017

(65) Prior Publication Data
US 2017/0271490 A1    Sep. 21, 2017

(30) Foreign Application Priority Data

Mar. 16, 2016  (JP) .................. 2016-052666

(51) Int. Cl.
| H01L 27/08 | (2006.01) |
| H01L 29/739 | (2006.01) |
| H01L 29/10 | (2006.01) |
| H01L 29/417 | (2006.01) |
| H01L 29/08 | (2006.01) |
| H01L 29/36 | (2006.01) |

(Continued)

(52) U.S. Cl.
CPC ...... *H01L 29/7397* (2013.01); *H01L 29/0692* (2013.01); *H01L 29/0804* (2013.01); *H01L 29/0821* (2013.01); *H01L 29/1004* (2013.01); *H01L 29/36* (2013.01); *H01L 29/41708* (2013.01); *H01L 29/4236* (2013.01)

(58) Field of Classification Search
None
See application file for complete search history.

(56) References Cited

U.S. PATENT DOCUMENTS

| 6,268,628 B1 | 7/2001 | Yoshida et al. |
| 6,781,199 B2 | 8/2004 | Takahashi |

(Continued)

FOREIGN PATENT DOCUMENTS

| EP | 0 889 531 A1 | 1/1999 |
| JP | H08-116056 A | 5/1996 |

(Continued)

*Primary Examiner* — Ali Naraghi
(74) *Attorney, Agent, or Firm* — Foley & Lardner LLP

(57) ABSTRACT

A semiconductor device includes a third electrode between a first semiconductor region and a second electrode, a fourth electrode between the first semiconductor region and the second electrode, a second semiconductor region between the first semiconductor region and the second electrode and between the third electrode and the fourth electrode, a third semiconductor region between the second semiconductor region and the second electrode, a fourth electrode between the first semiconductor region and the second electrode to be electrically connected to the second electrode, and a fifth semiconductor region between the first electrode and the first semiconductor region. A first insulating film is provided between the third electrode and the first semiconductor region, the second semiconductor region, the third semiconductor region and the second electrode. A second insulating film is provided between the fourth semiconductor region and the first semiconductor region, the second semiconductor region, and the fourth semiconductor region.

9 Claims, 30 Drawing Sheets

(51) Int. Cl.
    *H01L 29/06*     (2006.01)
    *H01L 29/423*    (2006.01)

(56)            References Cited

U.S. PATENT DOCUMENTS

| | | | |
|---|---|---|---|
| 6,803,609 | B1 | 10/2004 | Werner et al. |
| 8,853,775 | B2 | 10/2014 | Ogura et al. |
| 9,257,543 | B2 * | 2/2016 | Takahashi ........... H01L 29/7397 |
| 2004/0084722 | A1 | 5/2004 | Yamaguchi et al. |
| 2010/0327313 | A1 | 12/2010 | Nakamura |
| 2013/0221402 | A1 | 8/2013 | Ogura et al. |
| 2015/0091055 | A1 | 4/2015 | Gejo et al. |
| 2015/0349103 | A1 | 12/2015 | Onozawa et al. |
| 2016/0141400 | A1 * | 5/2016 | Takahashi ........... H01L 29/7397 |
| | | | 257/140 |
| 2016/0155832 | A1 * | 6/2016 | Tang .................. H01L 29/7397 |
| | | | 257/139 |
| 2016/0197143 | A1 | 7/2016 | Naito |

FOREIGN PATENT DOCUMENTS

| | | |
|---|---|---|
| JP | H11-68107 A | 3/1999 |
| JP | 2004-153112 A | 5/2004 |
| JP | 2007-221012 A | 8/2007 |
| JP | 2010-114276 A | 5/2010 |
| JP | 2015-072950 A | 4/2015 |
| WO | WO 2009/122486 A1 | 10/2009 |
| WO | WO-2015/022989 A1 | 2/2015 |
| WO | WO 2015/093190 A1 | 6/2015 |

\* cited by examiner

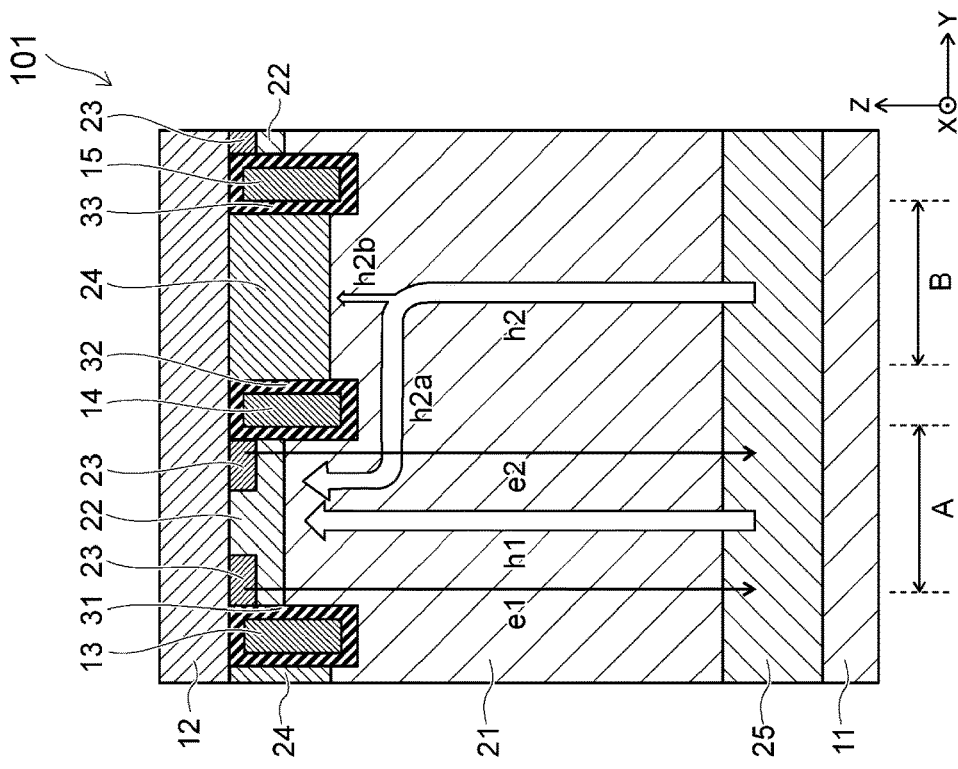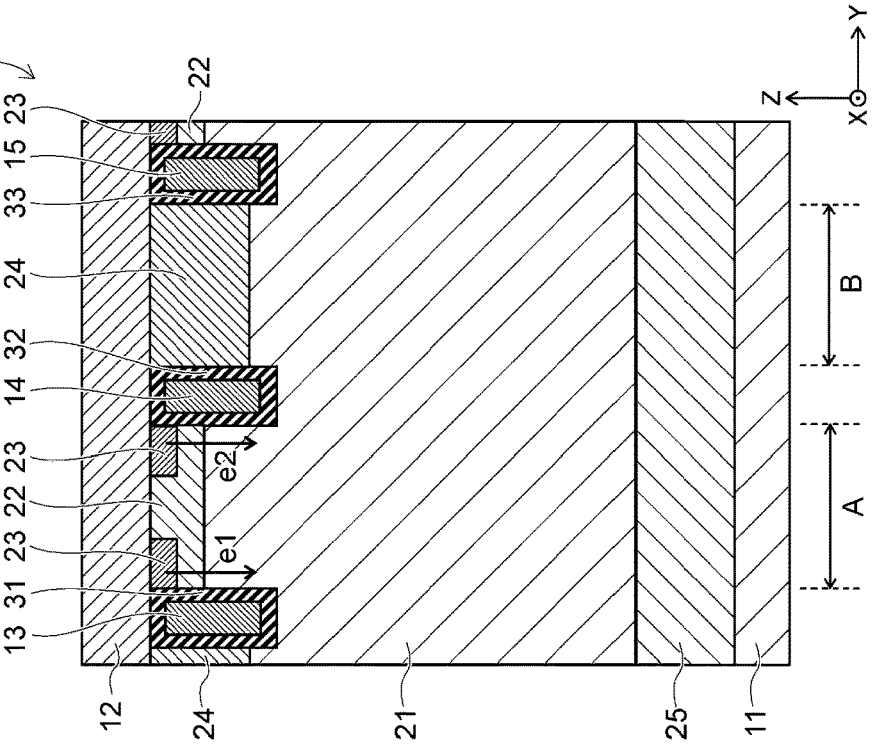

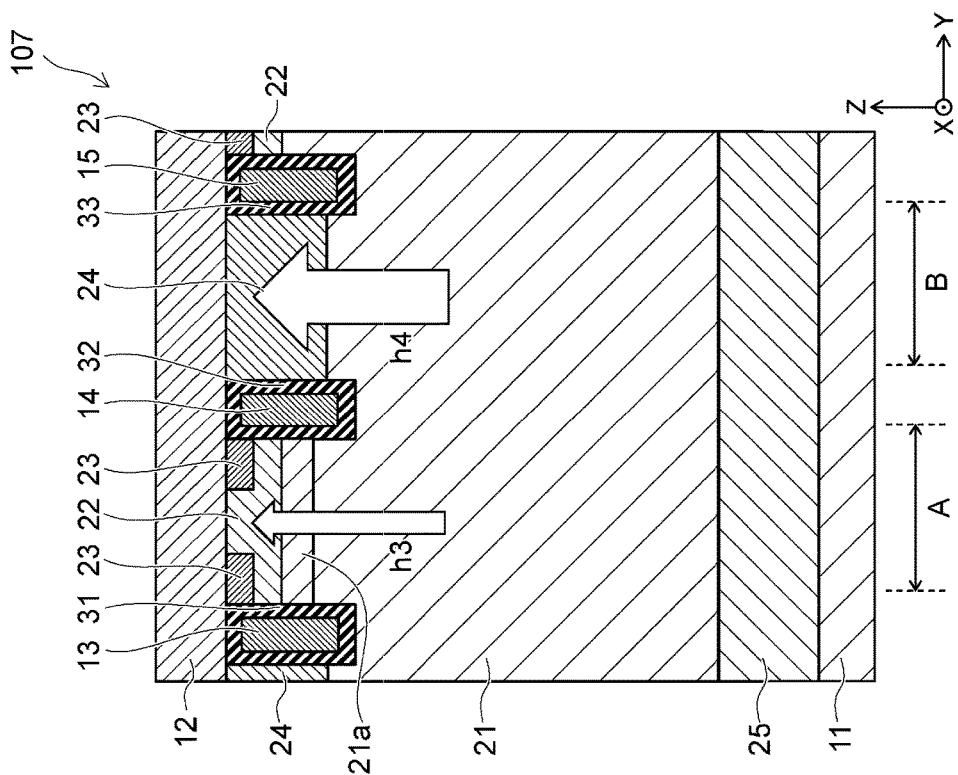
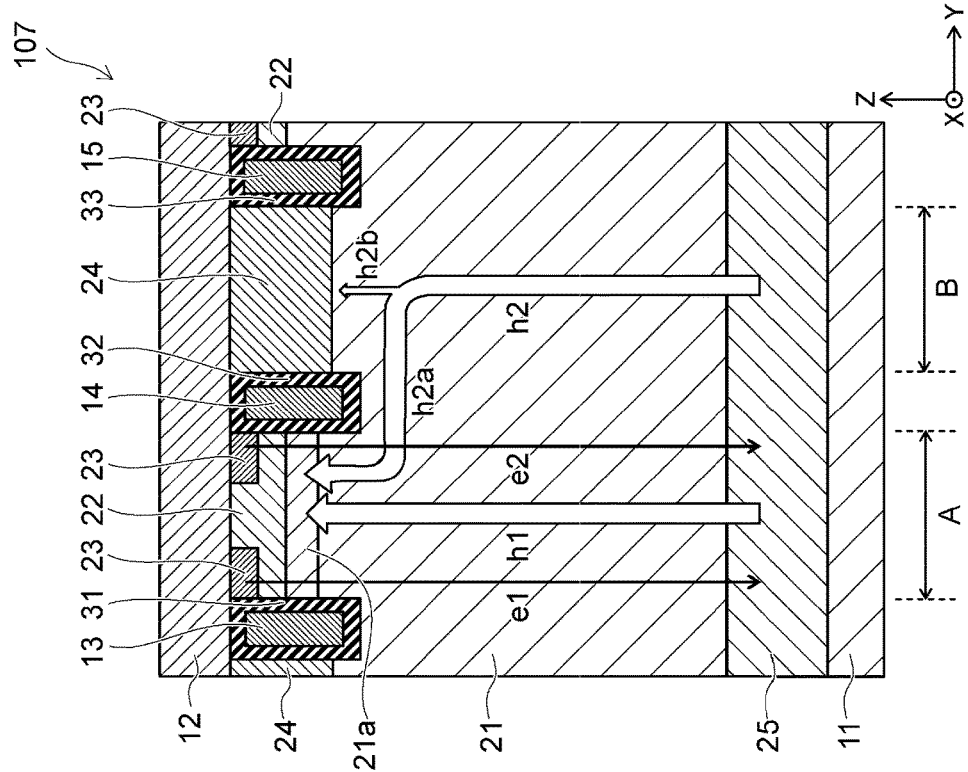

SEMICONDUCTOR DEVICE

CROSS-REFERENCE TO RELATED APPLICATION

This application claims the benefit of and priority to Japanese Patent Application No. 2016-052666, filed Mar. 16, 2016, the entire contents of which are incorporated herein by reference.

FIELD

Embodiments described herein relate generally to a semiconductor device.

BACKGROUND

One of a semiconductor device for power includes an IGBT (Insulated Gate Bipolar Transistor) having a trench gate structure. When the IGBT is used as a switching element, it may be desired that its on resistance is low and switching is fast. In the IGBT, since a pitch of a trench gate is shortened, a resistive component of a semiconductor region between trench gates becomes large, so that a so-called IE effect (Injection Enhanced) occurs. In this way, an on voltage becomes small. The IE effect also occurs when providing a barrier region for a carrier between the trench gates.

However, when the IE effect occurs by such a method, a carrier concentration of an emitter side may increase. In this way, during turn-off, since carriers are not quickly discharged to the emitter side, it is probable that switching loss during turn-off increases. As described above, there is a trade-off relation between reduction of an on voltage and reduction of switching loss during turn-off.

SUMMARY

In some embodiments according to one aspect, a semiconductor device may include a first electrode, a second electrode, a first semiconductor region of a first conductivity type, a third electrode, a fourth electrode, a second semiconductor region of a second conductivity type, a third semiconductor region of the first conductivity type, a fourth semiconductor region of the second conductivity type, a first insulating film, a second insulating film, a fifth semiconductor region of the second conductivity type, a first insulating film and a second insulating film. The first semiconductor region may be provided between the first electrode and the second electrode. The third electrode may be provided between the first semiconductor region and the second electrode. The fourth electrode may be provided between the first semiconductor region and the second electrode and aligned with the third electrode in a second direction intersecting a first direction toward the second electrode from the first electrode. The second semiconductor region may be provided between the first semiconductor region and the second electrode and between the third electrode and the fourth electrode, and electrically connected to the second electrode. The third semiconductor region may be provided between the second semiconductor region and the second electrode and electrically connected to the second electrode. The fourth semiconductor region may be provided between the first semiconductor region and the second electrode, aligned with the second semiconductor region via the fourth electrode in the second direction, and include a first region and a second region. The second region may have an impurity concentration higher than an impurity concentration of the first region. The second region may be provided between the first region and the second electrode in the first direction. The first region and the second region may be electrically connected to the second electrode. The first insulating film may be provided between (1) the third electrode and (2) the first semiconductor region, the second semiconductor region, the third semiconductor region, and the second electrode. the second insulating film that may be provided between (1) the fourth electrode and (2) the first semiconductor region, the second semiconductor region, and the fourth semiconductor region. The fifth semiconductor region may be provided between the first electrode and the first semiconductor region and electrically connected to the first electrode.

In some embodiments according to one aspect, a semiconductor device may include a first electrode, a second electrode, a first semiconductor region of a first conductivity type, a third electrode, a fourth electrode, a second semiconductor region of a second conductivity type, a third semiconductor region of the first conductivity type, a fourth semiconductor region of the second conductivity type, a fifth semiconductor region of the second conductivity type, a first insulating film and a second insulating film. The first semiconductor region may be provided between the first electrode and the second electrode. The third electrode may be provided between the first semiconductor region and the second electrode. The fourth electrode may be provided between the first semiconductor region and the second electrode and aligned with the third electrode in a second direction intersecting a first direction toward the second electrode from the first electrode. The second semiconductor region may be provided between the first semiconductor region and the second electrode and between the third electrode and the fourth electrode, and electrically connected to the second electrode. The third semiconductor region may be provided between the second semiconductor region and the second electrode and electrically connected to the second electrode. The fourth semiconductor region may be provided between the first semiconductor region and the second electrode to be electrically connected to the second electrode, and aligned with the second semiconductor region via the fourth electrode in the second direction. The first insulating film may be provided between (1) the third electrode and (2) the first semiconductor region, the second semiconductor region, the third semiconductor region, and the second electrode. The second insulating film may be provided between (1) the fourth electrode and (2) the first semiconductor region, the second semiconductor region, and the fourth semiconductor region. The fifth semiconductor region may be provided between the first electrode and the first semiconductor region and electrically connected to the first electrode. An impurity concentration profile of the first semiconductor region in the first direction may have a local maximum value between the third electrode and the fourth electrode.

Other aspects and embodiments of the disclosure are also encompassed. The foregoing summary and the following detailed description are not meant to restrict the disclosure to any particular embodiment but are merely meant to describe some embodiments of the disclosure.

DESCRIPTION OF THE DRAWINGS

FIG. 2A and FIG. 2B are schematic sectional views illustrating an operation of the semiconductor device according to some embodiments.

FIG. 14A and FIG. 14B are schematic sectional views illustrating an operation of the semiconductor device according to some embodiments.

DETAILED DESCRIPTION

Figure 1A:
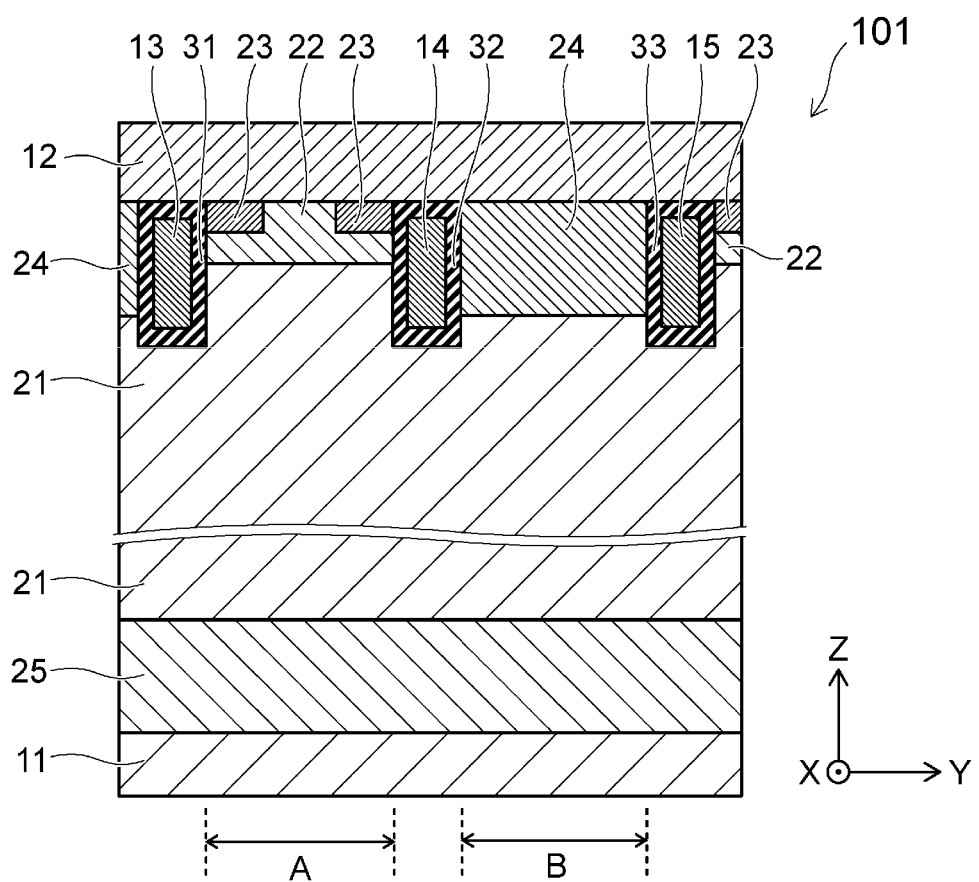
FIG. 1A is a schematic sectional view illustrating a semiconductor device according to some embodiments.

An example embodiment provides a semiconductor device that achieves reduction of an on voltage and reduction of switching loss during turn-off.

According to some embodiments, a semiconductor device includes a first electrode, a second electrode, a first semiconductor region of a first conductivity type, a third electrode, a fourth electrode, a second semiconductor region of a second conductivity type, a third semiconductor region of the first conductivity type, a fourth semiconductor region of the second conductivity type, a first insulating film, a second insulating film, and a fifth semiconductor region of the second conductivity type. The first semiconductor region of the first conductivity type may be provided between the first electrode and the second electrode. The third electrode may be provided between the first semiconductor region and the second electrode. The fourth electrode may be provided between the first semiconductor region and the second electrode and aligned with the third electrode in a second direction intersecting a first direction toward the second electrode from the first electrode. The second semiconductor region of the second conductivity type may be provided between the first semiconductor region and the second electrode and between the third electrode and the fourth electrode, and electrically connected to the second electrode. The third semiconductor region of the first conductivity type may be provided between the second semiconductor region and the second electrode and electrically connected to the second electrode. The fourth semiconductor region of the second conductivity type may be provided between the first semiconductor region and the second electrode to be aligned with the second semiconductor region via the fourth electrode in the second direction, and may include a first region and a second region. An impurity concentration of the second region may be higher than an impurity concentration of the first region, the second region may be provided between the first electrode and the second electrode in the first direction, and the first region and the second region may be electrically connected to the second electrode. The first insulating film may be provided between the third electrode and the first semiconductor region, the second semiconductor region, the third semiconductor region, and the second electrode. The second insulating film may be provided between the fourth electrode and the first semiconductor region, the second semiconductor region, and the fourth semiconductor region. The fifth semiconductor region of the second conductivity type may be provided between the first electrode and the first semiconductor region and may be electrically connected to the first electrode.

Hereinafter, embodiments will be described with reference to the drawings. In the embodiments, the same signs are attached to the substantially same components, and the description of the component which is described once will be omitted. The drawings are schematic and conceptual, and the dimension of each component may be different from an actual value. Even when the same component is described, the dimension and the ratio thereof may be different depending on the drawing in some cases.

In some embodiments, an n-type (a first conductivity type) impurity concentration relatively becomes low in a sequence of an n$^+$ type, an n-type, and an n$^-$ type. A p-type (a second conductivity type) impurity concentration relatively becomes low in a sequence of a p+ type and a p-type. In the drawings, a three-dimensional coordinate (an X axis, a Y axis, and a Z axis) may be introduced. The X axis and the Y axis/the Z axis intersect each other, and the Y axis and the Z axis intersect each other.

Figure 1B:
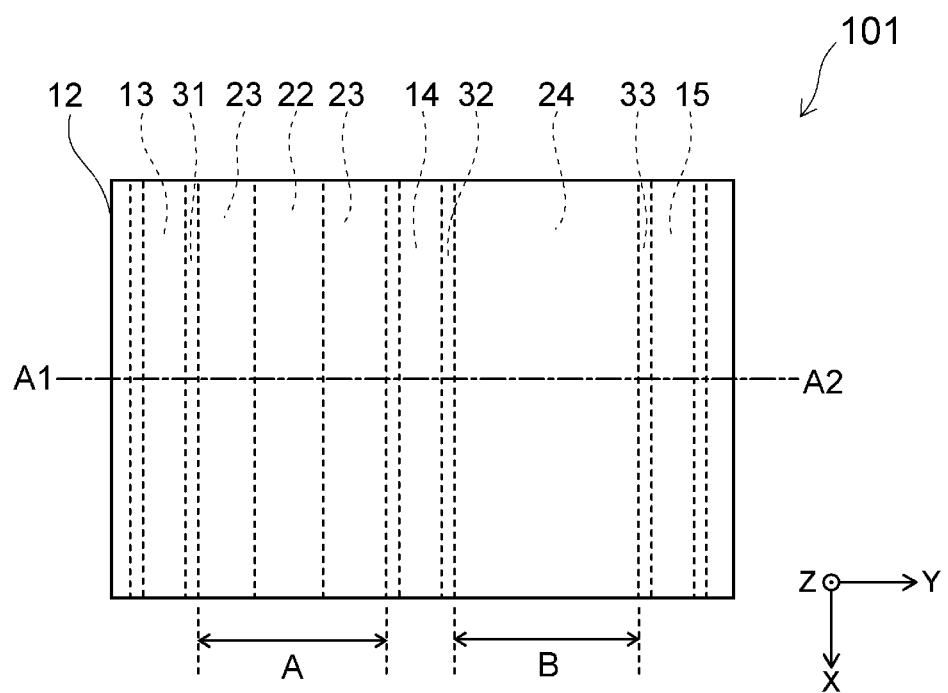
FIG. 1B is a schematic plan view illustrating the semiconductor device according to some embodiments.

FIG. 1A is a schematic sectional view illustrating a semiconductor device according to some embodiments. FIG. 1B is a schematic plan view illustrating the semiconductor device according to some embodiments. FIG. 1A illustrates a section taken along line A1-A2 of FIG. 1B.

A semiconductor device 101 illustrated in FIG. 1A is an IGBT having a vertical electrode structure. In some embodiments, the semiconductor device 101 includes a first electrode (hereinafter, for example, a collector electrode 11), a second electrode (hereinafter, for example, an emitter electrode 12), a third electrode 13, a fourth electrode 14, a fifth electrode 15, a first semiconductor region (hereinafter, for example, an n⁻ type base region 21), a second semiconductor region (hereinafter, for example, a p-type base region 22), a third semiconductor region (hereinafter, for example, an n+ type emitter region 23), a fourth semiconductor region (hereinafter, for example, a p-type semiconductor region 24), a fifth semiconductor region (hereinafter, for example, a p+ type collector region 25), a first insulating film 31, a second insulating film 32, and a third insulating film 33.

In some embodiments, the collector electrode 11 is a lower electrode of the semiconductor device 101. In some embodiments, the collector electrode 11 extends in an X axis direction and a Y axis direction. In some embodiments, the emitter electrode 12 is an upper electrode of the semiconductor device 101. In some embodiments, the emitter electrode 12 is provided above the collector electrode 11. The "provided above" includes "indirectly provided above", additionally to "directly provided above". The emitter electrode 12 extends in the X axis direction and the Y axis direction. In some embodiments, semiconductor layers, other electrodes, insulating films and the like are provided between the collector electrode 11 and the emitter electrode 12.

In some embodiments, the n⁻ type base region 21 is provided between the collector electrode 11 and the emitter electrode 12. In some embodiments, the n⁻ type base region 21 is provided on the p+ type collector region 25. In some embodiments, the n⁻ type base region 21 is in contact with the p+ type collector region 25. The "contact" includes an "indirect contact", additionally to a "direct contact".

In some embodiments, the n⁻ type base region 21 has a predetermined thickness in a Z axis direction. In some embodiments, the n⁻ type base region 21 extends in the X axis direction and the Y axis direction. The n⁻ type base region 21 may be a layer segmented from a semiconductor wafer substrate or may be an epitaxial growth layer. An impurity concentration of the n⁻ type base region 21, for example, is equal to or less than $1\times10^{15}$ (atoms/cm³), and can be set as an impurity concentration based on a breakdown voltage of an element.

In some embodiments, the p+ type collector region 25 is provided between the collector electrode 11 and the n⁻ type base region 21. In some embodiments, the p+ type collector region 25 is provided on the collector electrode 11. In some embodiments, the p+ type collector region 25 is electrically connected to the collector electrode 11. The "connection" includes an "indirect connection", additionally to a "direct connection". For example, the p+ type collector region 25 makes an ohmic contact with the collector electrode 11. In some embodiments, the p+ type collector region 25 is also in contact the n⁻ type base region 21.

In some embodiments, the p+ type collector region 25 has a predetermined thickness in the Z direction. In some embodiments, the p+ type collector region 25 extends in the X axis direction and the Y axis direction. In the X axis direction or the Y axis direction, the p+ type collector region 25 may be divided. In some embodiments, a maximum value of an impurity concentration of the p+ type collector region 25 is higher than $1\times10^{17}$ (atoms/cm³), and for example, is equal to or more than $1\times10^{18}$ (atoms/cm³). The impurity concentration of the p+ type collector region 25 may be set to be higher toward the collector electrode 11.

In some embodiments, the p-type base region 22 is provided between the n⁻ type base region 21 and the emitter electrode 12. In some embodiments, the p-type base region 22 is selectively provided on the n⁻ type base region 21. In some embodiments, the p-type base region 22 is electrically connected to the emitter electrode 12. For example, the p-type base region 22 makes a low resistance contact with or an ohmic contact with the emitter electrode 12. In some embodiments, the p-type base region 22 also is in contact with the n⁻ type base region 21.

In some embodiments, the p-type base region 22 is provided between the third electrode 13 and the fourth electrode 14 in the Y direction. In some embodiments, the p-type base region 22 is in contact with the first insulating film 31 and the second insulating film 32. In some embodiments, the p-type base region 22 has a predetermined thickness in the Z axis direction. In some embodiments, the p-type base region 22 extends in the X axis direction. An impurity concentration of the p-type base region 22, for example, is equal to or more than $1\times10^{15}$ (atoms/cm³) and is equal to or less than $5\times10^{17}$ (atoms/cm³). The impurity concentration of the p-type base region 22 may be set to be high toward the emitter electrode 12.

In some embodiments, the n+ type emitter region 23 is provided between the p-type base region 22 and the emitter electrode 12. In some embodiments, the n+ type emitter region 23 is selectively provided on the p-type base region 22. For example, the p-type base region 22 is provided thereon with the n+ type emitter region 23 coming in contact with the first insulating film 31 and the n+ type emitter region 23 coming in contact with the second insulating film 32. In some embodiments, each of the n+ type emitter regions 23 is electrically connected to the emitter electrode 12. For example, each of the n+ type emitter regions 23 makes an ohmic contact with the emitter electrode 12. In some embodiments, each of the n+ type emitter regions 23 also is in contact with the p-type base region 22.

In some embodiments, each of the n+ type emitter regions 23 has a predetermined thickness in the Z axis direction. In some embodiments, each of the n+ type emitter regions 23 extends in the X axis direction. In some embodiments, a maximum value of an impurity concentration of the n+ type emitter region 23 is higher than $3\times10^{17}$ (atoms/cm³), and for example, is equal to or more than $1\times10^{18}$ (atoms/cm³). The impurity concentration of the n+ type emitter region 23 may be set to be high toward the emitter electrode 12. In some embodiments, the n+ type emitter region 23 and the p-type base region 22 are provided between the third electrode 13 and the fourth electrode 14.

In some embodiments, the p-type semiconductor region 24 is provided between the n⁻ type base region 21 and the emitter electrode 12. In some embodiments, the p-type semiconductor region 24 is electrically connected to the emitter electrode 12. For example, the p-type semiconductor region 24 makes a low resistance contact with or an ohmic contact with the emitter electrode 12. In some embodiments, the p-type semiconductor region 24 also is in contact with the n⁻ type base region 21. In some embodiments, the p-type semiconductor region 24 is aligned with (e.g., spaced apart from) the p-type base region 22 via the fourth electrode 14 in the Y axis direction. In some embodiments, the p-type semiconductor region 24 is provided between the fourth electrode 14 and the fifth electrode 15. In some embodiments, the p-type semiconductor region 24 is in contact with the second insulating film 32 and the third insulating film 33. In some embodiments, the p-type semiconductor region 24 has a predetermined thickness in the Z axis direction. In some embodiments, the p-type semiconductor region 24 extends in the X axis direction. An impurity concentration of the p-type semiconductor region 24, for example, is equal to or more than $1\times10^{15}$ (atoms/cm³) and is equal to or less than $5\times10^{17}$ (atoms/cm³). The impurity concentration of the p-type semiconductor region 24 may be set to be high toward the emitter electrode 12.

In some embodiments, a direction (a first direction) toward the emitter electrode 12 from the collector electrode 11 is defined as the Z axis direction. In some embodiments, the p-type semiconductor region 24 is provided beside the p-type base region 22 in a direction (a second direction) intersecting the Z axis direction, that is, in the Y axis direction. For example, in the example of FIGS. 1A and 1B, the p-type base region 22 and the p-type semiconductor region 24 are aligned with (e.g., spaced apart from) each other in the Y axis direction.

In some embodiments, the sum of the impurity concentration of the p-type semiconductor region 24 is lower than that of the impurity concentration of the p-type base region 22. In some embodiments, in the Z axis direction, a distance between the p-type semiconductor region 24 and the collector electrode 11 is shorter than that between the p-type base region 22 and the collector electrode 11. For example, a distance between an interface between the p-type semiconductor region 24 and the n⁻ type base region 21 and an upper end of the collector electrode 11 is shorter than that between an interface between the p-type base region 22 and the n⁻ type base region 21 and the upper end of the collector electrode 11. In some embodiments, the thickness of the p-type semiconductor region 24 in the Z axis direction is thicker than that of the p-type base region 22 in the Z axis direction.

Some embodiments include a configuration in which the distance between the interface between the p-type semiconductor region 24 and the n⁻ type base region 21 and the upper end of the collector electrode 11 becomes longer than that between an interface between the p-type base region 22 and the n⁻ type base region 21 and the upper end of the collector electrode 11. In this case, in some embodiments, the thickness of the p-type semiconductor region 24 in the Z axis direction is thinner than that of the p-type base region 22 in the Z axis direction.

Moreover, some embodiments include a configuration in which the distance between (1) the interface between the p-type semiconductor region 24 and the n⁻ type base region 21 and (2) the upper end of the collector electrode 11 is equal to that between (1) an interface between the p-type base region 22 and the n⁻ type base region 21 and (2) the upper end of the collector electrode 11. In this case, in some embodiments, the thickness of the p-type semiconductor region 24 in the Z axis direction is equal to that of the p-type base region 22 in the Z axis direction.

In some embodiments, the third electrode 13 is provided between the n⁻ type base region 21 and the emitter electrode 12. In some embodiments, the third electrode 13 is provided above the n⁻ type base region 21. The third electrode 13 is an IGBT gate electrode. In some embodiments, the third electrode 13 has a predetermined thickness in the Z axis direction. In some embodiments, the third electrode 13 extends in the X axis direction.

In some embodiments, the first insulating film 31 is provided between (1) the third electrode 13 and (2) the n⁻ type base region 21, the p-type base region 22, the n⁺ type emitter region 23, and the emitter electrode 12. In some embodiments, the first insulating film 31 is an IGBT gate insulating film.

In some embodiments, the fourth electrode 14 is provided between the n⁻ type base region 21 and the emitter electrode 12. In some embodiments, the fourth electrode 14 is provided above the n⁻ type base region 21. In some embodiments, in the Y axis direction, the fourth electrode 14 is aligned with (e.g., parallel with or spaced apart from) the third electrode 13. In some embodiments, the fourth electrode 14 is provided between the p-type base region 22 and the p-type semiconductor region 24. In some embodiments, the p-type base region 22 and the p-type semiconductor region 24 are separated from each other by the fourth electrode 14. In some embodiments, the fourth electrode 14 is an IGBT gate electrode. In some embodiments, the fourth electrode 14 has a predetermined thickness in the Z axis direction. In some embodiments, the fourth electrode 14 extends in the X axis direction.

The second insulating film 32 is provided between the fourth electrode 14 and the n⁻ type base region 21, the n⁺ type emitter region 23, the p-type base region 22, and the p-type semiconductor region 24.

In some embodiments, the fifth electrode 15 is provided between the n⁻ type base region 21 and the emitter electrode 12. In some embodiments, the fifth electrode 15 is provided above the n⁻ type base region 21. In some embodiments, the fifth electrode 15 is aligned with (e.g., spaced apart from) the fourth electrode 14 in the Y axis direction. In some embodiments, the fifth electrode 15 is provided at an opposite side to the third electrode 13 in the Y axis direction. In some embodiments, the fifth electrode 15 is an IGBT gate electrode. In some embodiments, the fifth electrode 15 has a predetermined thickness in the Z axis direction. In some embodiments, the fifth electrode 15 extends in the X axis direction. In some embodiments, the third electrode 13, the fourth electrode 14, and the fifth electrode 15 are aligned (e.g., parallel with one another or spaced apart from one another) in this order in the Y axis direction.

In some embodiments, the third insulating film 33 is provided between the fifth electrode 15 and the n⁻ type base region 21/the p-type semiconductor region 24.

In some embodiments, a distance between the third electrode 13 and the collector electrode 11, a distance between the fourth electrode 14 and the collector electrode 11, and a distance between the fifth electrode 15 and the collector electrode 11 are approximately equal to one another. The third electrode 13, the fourth electrode 14, and the fifth electrode 15 may be simultaneously formed in the same manufacturing process.

In the Y axis direction, when a region where the p-type base region 22 is disposed is defined as a region A and a region where the p-type semiconductor region 24 is disposed is defined as a region B, in some embodiments, the region A and the region B are disposed alternately in the Y axis direction. For example, the region A and the region B are disposed in the Y axis direction in a sequence of the region A/the region B/the region A/the region B/the region A/the region B In some embodiments, in the semiconductor device 101, a length of the region A and a length of the region B are equal to each other in the Y axis direction. The length of the region A and the length of the region B in the Y axis direction, for example, are equal to or less than 6.0 µm.

Main component of each semiconductor region in some embodiments, for example, is silicon (Si). The main component of each semiconductor region may be silicon carbide (SiC), gallium nitride (GaN) and the like. As a first conductivity type impurity element, for example, phosphorous (P), arsenic (As) and the like are employed. As a second conductivity type impurity element, for example, boron (B) and the like are employed. In the present disclosure, the n channel type IGBT is employed as an example; however, a p channel type IGBT can be also employed.

Furthermore, the "impurity concentration (atoms/cm$^3$)" indicates an effective concentration of an impurity element contributing to conductivity of a semiconductor material. For example, when a semiconductor material contains an impurity element serving as a donor and an impurity element serving as an acceptor, a concentration obtained by removing an offset component of the donor and the acceptor from the activated impurity element is called an effective impurity concentration. Furthermore, a concentration of an electron or a hole ionized from an effective impurity element is called a carrier concentration. The level of the impurity concentration according to some embodiments is compared to a maximum value or an average value of an impurity concentration profile in the Z axis direction. The impurity concentration can be analyzed by SIMS analysis. An electrically activated carrier concentration can be analyzed by SR analysis.

In some embodiments, a material of the collector electrode 11, the emitter electrode 12, the third electrode 13, the fourth electrode 14, or the fifth electrode 15, for example, is a metal including at least one selected from the group consisting of aluminum (Al), titanium (Ti), nickel (Ni), tungsten (W), gold (Au), polysilicon and the like.

Furthermore, the first insulating film 31, the second insulating film 32, or the third insulating film 33, for example, includes silicon oxide (SiO$_2$) or silicon nitride (Si$_3$N$_4$).

An operation of the semiconductor device 101 according to some embodiments will be described.

Figure 3:
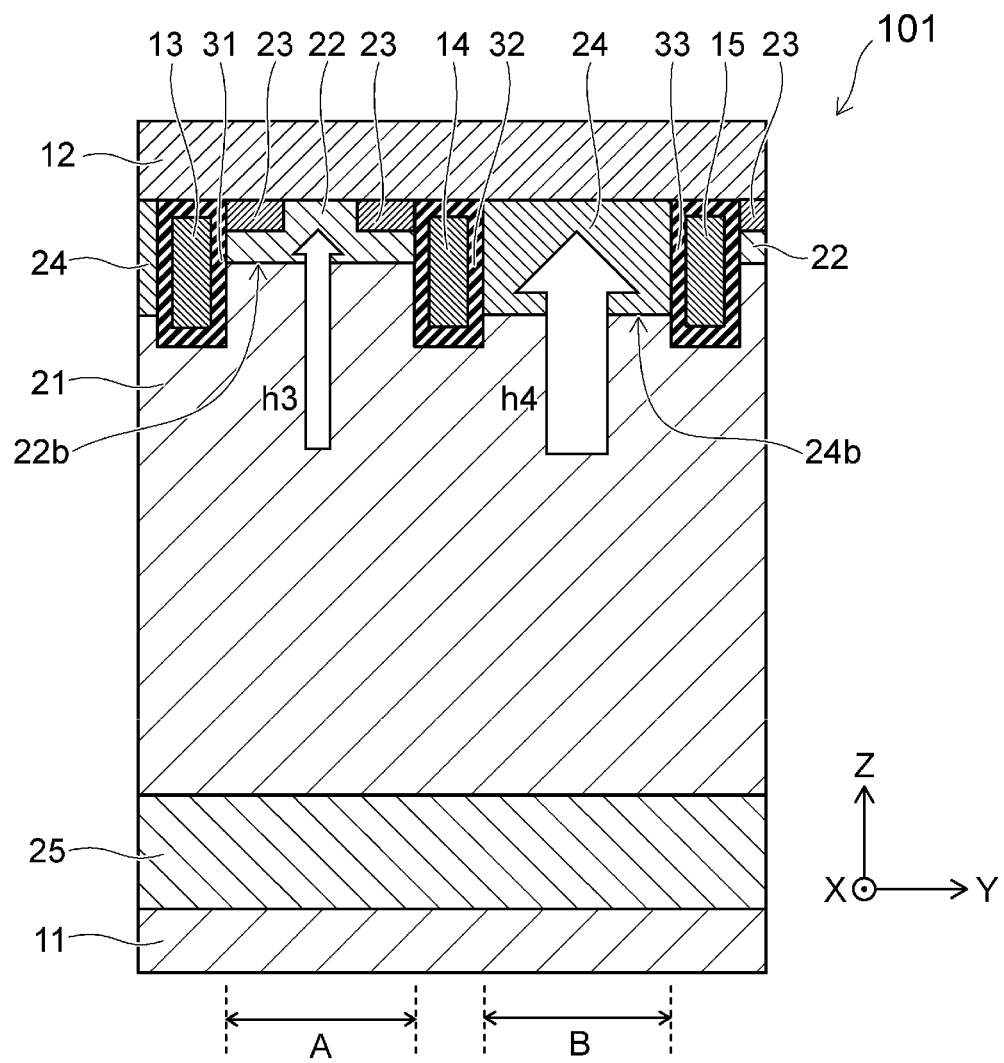
FIG. 3 is a schematic sectional view illustrating an operation of the semiconductor device according to some embodiments.

FIGS. 2A to 3 are schematic sectional views illustrating the operation of the semiconductor device according to some embodiments. In FIGS. 2A to 3, an operation in a region between the third electrode 13 and the fifth electrode 15 is illustrated as an example.

FIG. 2A illustrates a state after turning on. For example, a potential higher than that of the emitter electrode is applied to the collector electrode 11. In some embodiments, a potential equal to or more than a threshold potential Vth is applied to the third electrode 13, the fourth electrode 14, and the fifth electrode 15. In this way, in the p-type base region 22, a channel region may be formed along the first insulating film 31 and the second insulating film 32. In this way, electron currents e1 and e2 may flow through the n$^-$ type base region 21 from the n$^+$ type emitter region 23 via the channel.

In some embodiments, when electrons are accumulated in the n$^-$ type base region 21, an energy barrier between the p$^+$ type collector region 25 and the n$^-$ type base region 21 is lowered for holes. In this way, holes may be injected from the p$^+$ type collector region 25. In this way, after turning on, the electrons and the holes may be accumulated in the n$^-$ type base region 21. In the present disclosure, the state "after turning on" will be referred to as an ON state.

For example, as illustrated in FIG. 2B, the electron current e1 injected from the n$^+$ type emitter region 23 of the left side reaches the p$^+$ type collector region 25 below the n$^+$ type emitter region 23. The electron current e2 injected from the n$^+$ type emitter region 23 of the right side reaches the p$^+$ type collector region 25 below the n$^+$ type emitter region 23. In FIG. 2B, respective paths of the electron currents e1 and e2 are indicated by straight lines as an example, but may be deflected from the straight lines as they go to the collector side. On the other hand, holes may be injected from the p$^+$ type collector region 25. In FIG. 2B, states after the hole injection are indicated as hole currents h1 and h2.

For example, the hole current h1 injected from the p$^+$ type collector region 25 below the p-type base region 22 flows to the emitter electrode 12 via the n$^-$ type base region 21 below the p-type base region 22 and the p-type base region 22.

Into the n$^-$ type base region 21 below the p-type base region 22, many electrons may be injected. In this way, in the on state, resistance of the n$^-$ type base region 21 below the p-type base region 22 may be lower than that of the n$^-$ type base region 21 below the p-type semiconductor region 24.

In this way, the hole current h2 injected from the p$^+$ type collector region 25 below the p-type semiconductor region 24 may easily flow to the n$^-$ type base region 21 below the p-type base region 22 having a relatively low resistance. As a consequence, a hole current h2a of the hole current h2, which flows through the p-type base region 22, may become larger than a hole current h2b flowing through the p-type semiconductor region 24. In other words, the hole current h1 and the hole current h2a, which is the majority of the hole current h2, may be concentrated on the n$^-$ type base region 21 below the p-type base region 22.

In this way, in the semiconductor device 101, there may occur an IE effect that a carrier distribution of the n$^-$ type base region 21 below the p-type base region 22 increases at the emitter electrode 12 side. As a consequence, in the semiconductor device 101, on resistance in an ON state may be reduced, so that an on voltage may be lowered.

FIG. 3 illustrates a state during turning off. In some embodiments, when a potential smaller than the threshold potential is supplied to the third electrode 13, the fourth electrode 14, and the fifth electrode 15, the channel region may be lost, so that electron injection from the n$^+$ type emitter region 23 can be blocked. In this way, the resistance of the n$^-$ type base region 21 below the p-type base region 22 and the resistance of the n$^-$ type base region 21 below a p-type semiconductor region 24b can be approximately equal to each other. In this way, holes remaining in the n$^-$ type base region 21 can be discharged to the emitter electrode 12 via a p-type base region 22b and the p-type semiconductor region 24.

In some embodiments, the impurity concentration of the p-type base region 22b can be lower than that of the p-type semiconductor region 24b.

In some embodiments, the sum of the impurity concentration of the p-type semiconductor region 24b is lower than that of the impurity concentration of the p-type base region 22b, thereby a potential barrier of the p-type semiconductor region 24b becomes lower for holes as compared with the p-type base region 22 between a pair of n$^+$ type emitter regions 23. In this way, holes can easily flow through the emitter electrode 12 via the p-type semiconductor region 24b as compared with the case of flowing through the emitter electrode 12 via the p-type base region 22b.

For example, FIG. 3 illustrates holes h3 discharged to the emitter electrode 12 via the p-type base region 22b and holes h4 discharged to the emitter electrode 12 via the p-type semiconductor region 24b. In some embodiments, a current formed by the holes h4 may be larger than that formed by the holes h3. In some embodiments, the thickness of the p-type semiconductor region 24b in the Z axis direction is thicker than that of the p-type base region 22b in the Z axis direction, thereby this effect further increases.

That is, in some embodiments, in the semiconductor device 101, the p-type semiconductor region 24b is provided additionally to the p-type base region 22b, so that holes are quickly discharged to the emitter electrode 12 via the p-type base region 22b and the p-type semiconductor region 24b during turning off. In this way, in the semiconductor device 101, switching loss during turning off can be reduced.

As described above, in some embodiments, in the semiconductor device 101, an on voltage can be reduced and switching loss during turning off can be reduced.

Furthermore, in some embodiments, in the Y axis direction, a plurality of regions A and a plurality of regions B may form a pair and be disposed alternately. For example, they may be disposed in a sequence of the region A/the region A/the region B/the region B/the region A/the region A/the region B/the region B/the region A/the region A/the region B/the region B, or in a sequence of the region A/the region A/the region B/the region B/the region B/the region A/the region A/the region A/the region B/the region B/the region A/the region A/the region A/the region B/the region B/the region B. Furthermore, in some embodiments, the number of pairs of the regions A and the number of pairs of the regions B may be different from each other. For example, they may be disposed in a sequence of the region A/the region B/the region B/the region A/the region B/the region B/the region A/the region B/the region B, or in a sequence of the region A/the region A/the region B/the region A/the region A/the region B/the region A/the region B.

For example, when a large current is prioritized, the regions A and B are disposed such that the number of regions A where a channel is formed is larger than that of regions B. On the other hand, when the reduction of switching loss after turning off is prioritized, the regions A and B are disposed such that the number of regions B is larger than that of regions A. As described above, combinations of the regions A and the regions B are changed, so that it is possible to simply select whether a large current is prioritized or the reduction of switching loss during turning off is prioritized.

Figure 4:
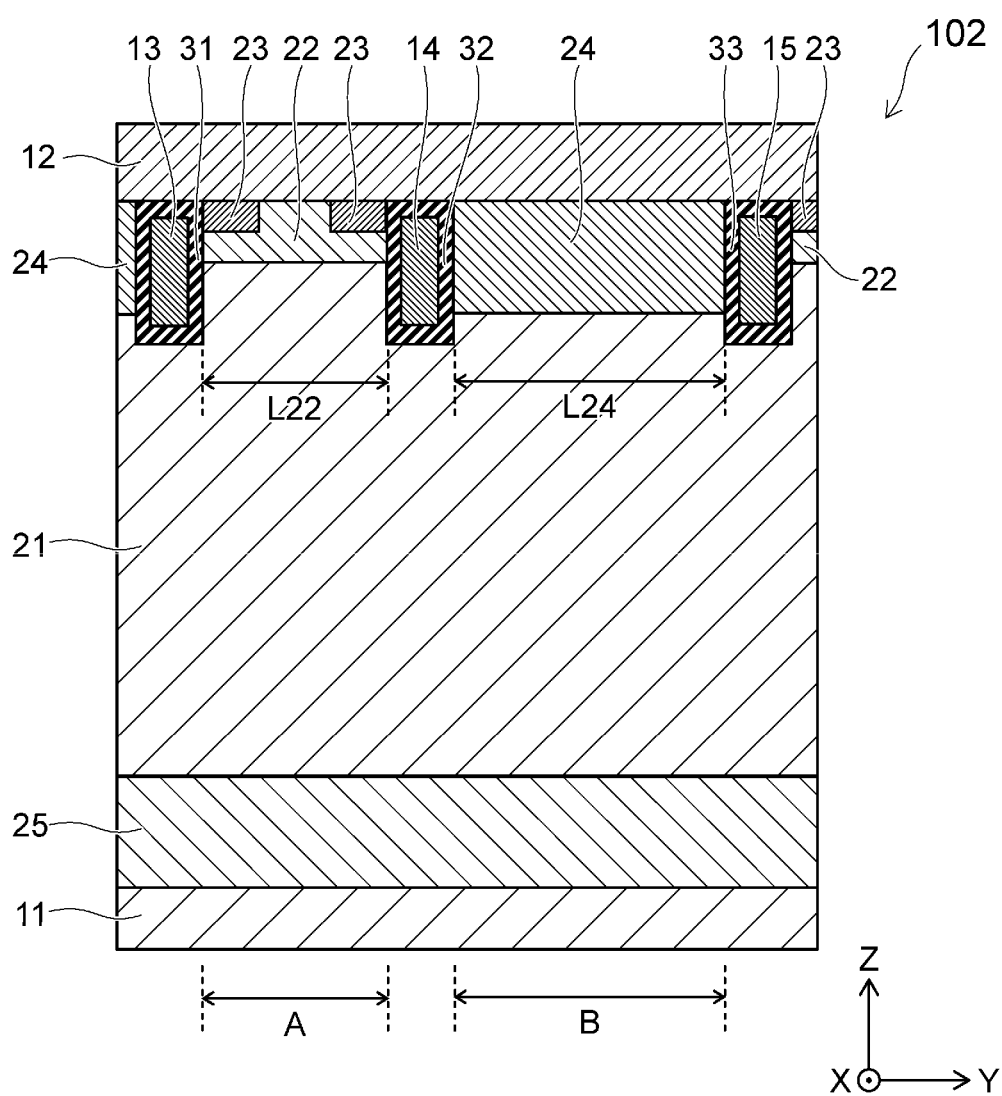
FIG. 4 is a schematic sectional view illustrating a semiconductor device according to some embodiments.

FIG. 4 is a schematic sectional view illustrating a semiconductor device according to some embodiments.

In some embodiments, in a semiconductor device 102, in the Y axis direction, a length L24 of the p-type semiconductor region 24 is longer than a length L22 of the p-type base region 22. For example, a length of a region A is equal to or more than 1 μm and is equal to or less than 6 μm. In some embodiments, a length of a region B is equal to or more than 2 μm and is equal to or less than 10 μm.

In this way, during turning off, holes can be easily and quickly discharged by the emitter electrode 12 via the wide p-type semiconductor region 24. In this way, in the semiconductor device 102, switching loss during turning off can be further reduced as compared with the semiconductor device 101.

Figure 5A:
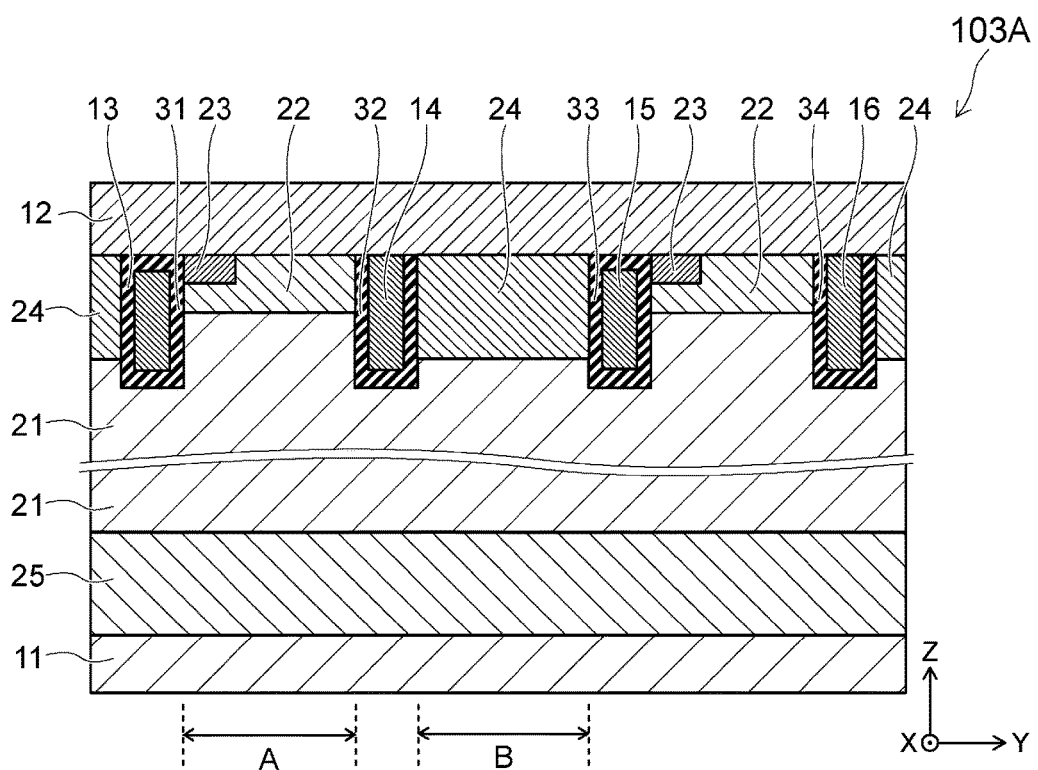
FIG. 5A is a schematic sectional view illustrating a semiconductor device according to some embodiments.
Figure 5B:
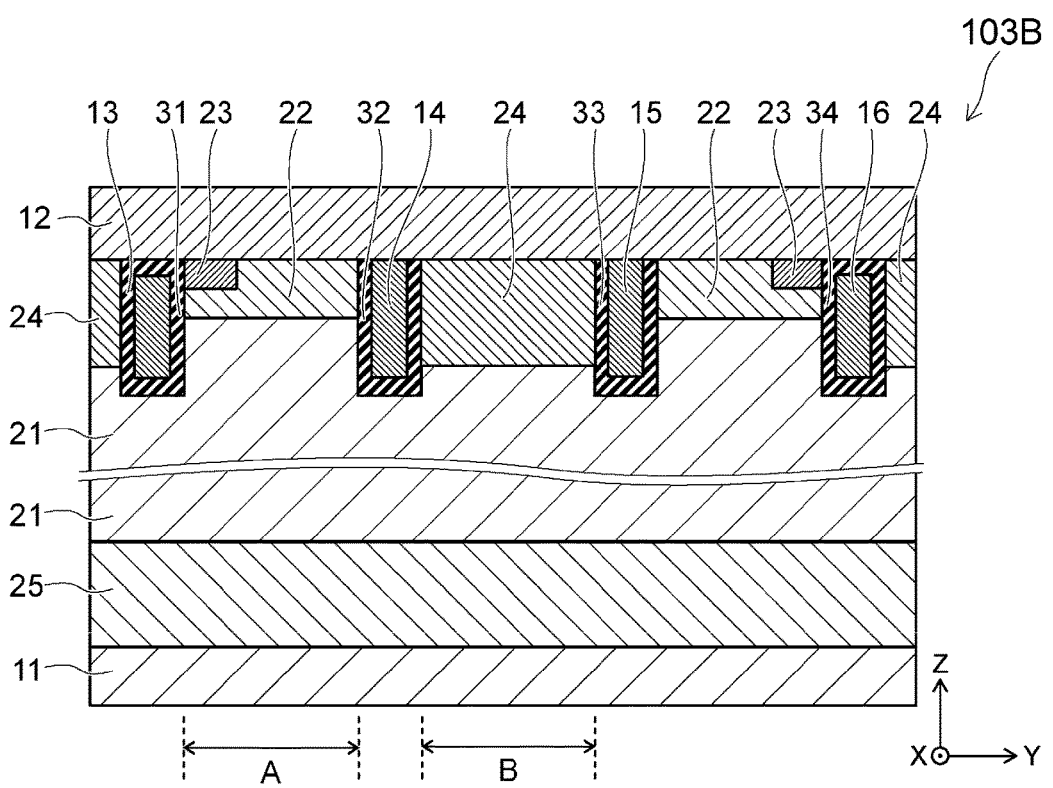
FIG. 5B is a schematic sectional view illustrating a semiconductor device according to some embodiments.

FIG. 5A is a schematic sectional view illustrating a semiconductor device according to some embodiments. FIG. 5B is a schematic sectional view illustrating a semiconductor device according to some embodiments.

In some embodiments, in a semiconductor device 103A illustrated in FIG. 5A, the $n^+$ type emitter region 23 is provided at the third electrode 13 side and is not provided at the fourth electrode 14 side. For example, the $n^+$ type emitter region 23 is in contact with the first insulating film 31. The $n^+$ type emitter region 23 is not in contact with the second insulating film 32. Furthermore, in some embodiments, the fourth electrode 14 is electrically connected to the emitter electrode 12. For example, the fourth electrode 14 is in contact with the emitter electrode 12.

In some embodiments, in the Y axis direction, the p-type base region 22 is aligned with (e.g., spaced apart from) the p-type semiconductor region 24 via the fifth electrode 15. In some embodiments, the $n^+$ type emitter region 23 provided in the p-type base region 22 is in contact with the third insulating film 33. Furthermore, in some embodiments, in the Y axis direction, a sixth electrode 16 is aligned with (e.g., parallel with or spaced apart from) the fifth electrode 15 via the p-type base region 22. In some embodiments, between the sixth electrode 16 and the p-type base region 22/the $n^-$ type base region 21, a fourth insulating film 34 is provided.

In the semiconductor device 103B illustrated in FIG. 5B, in some embodiments, the emitter electrode 12 is electrically connected to each of the fourth electrode 14 and the fifth electrode 15. For example, each of the fourth electrode 14 and the fifth electrode 15 is in contact with the emitter electrode 12. Furthermore, in some embodiments, the $n^+$ type emitter region 23 is in contact with the fourth insulating film 34.

In some embodiments, the structure in which an insulating film is interposed between the $n^+$ type emitter region 23 and the gate electrode (e.g., the third electrode 13) is reduced, so that a parasitic capacitance Cge between the gate electrode and the emitter electrode is reduced. In this way, current loss of gate drives for controlling the potentials of the gate electrodes of the semiconductor devices 103A and 103B can be reduced. Moreover, switching operations of the semiconductor devices 103A and 103B can become more fast.

Figure 6:
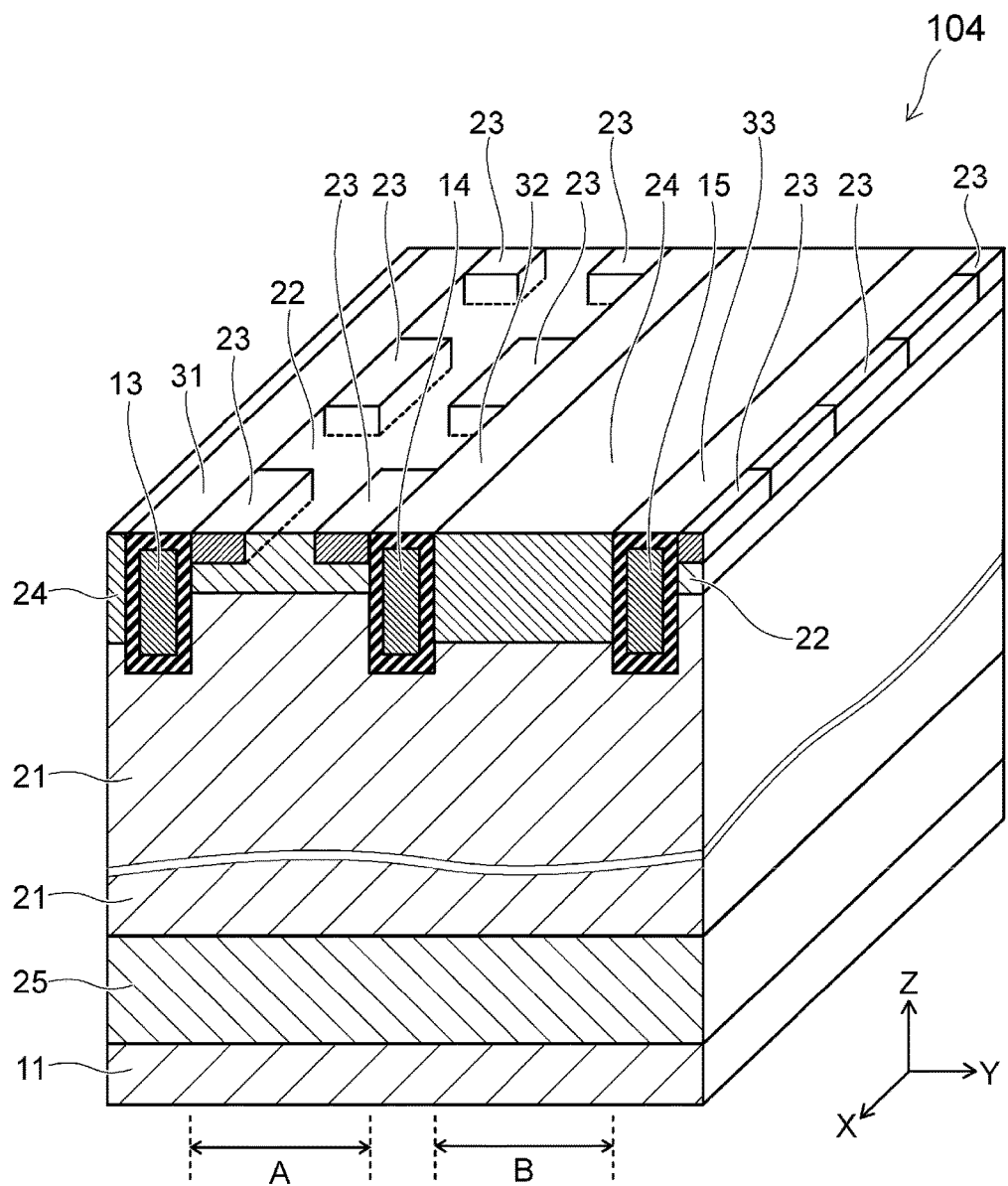
FIG. 6 is a schematic perspective view illustrating a semiconductor device according to some embodiments.

FIG. 6 is a schematic perspective view illustrating a semiconductor device according to some embodiments. In FIG. 6, the emitter electrode 12 is not illustrated.

In some embodiments, in a semiconductor device 104, the $n^+$ type emitter region 23 is divided in the X axis direction. For example, the $n^+$ type emitter region 23 includes a plurality of regions. The plurality of regions, for example, are periodically disposed in the X axis direction.

A length of the $n^+$ type emitter region 23 in the X axis direction is defined as a channel width W (not shown) and a depth of the $n^+$ type emitter region 23 in the Z axis direction is defined as a channel length L (not shown). In some embodiments, in the semiconductor device 104, the $n^+$ type emitter region 23 is divided, so that a value (the channel width W/the channel length L) obtained by dividing the channel width W by the channel length L can be further reduced. In this way, in the semiconductor device 104, it is possible to suppress a saturation current in an ON state.

Figure 7A:
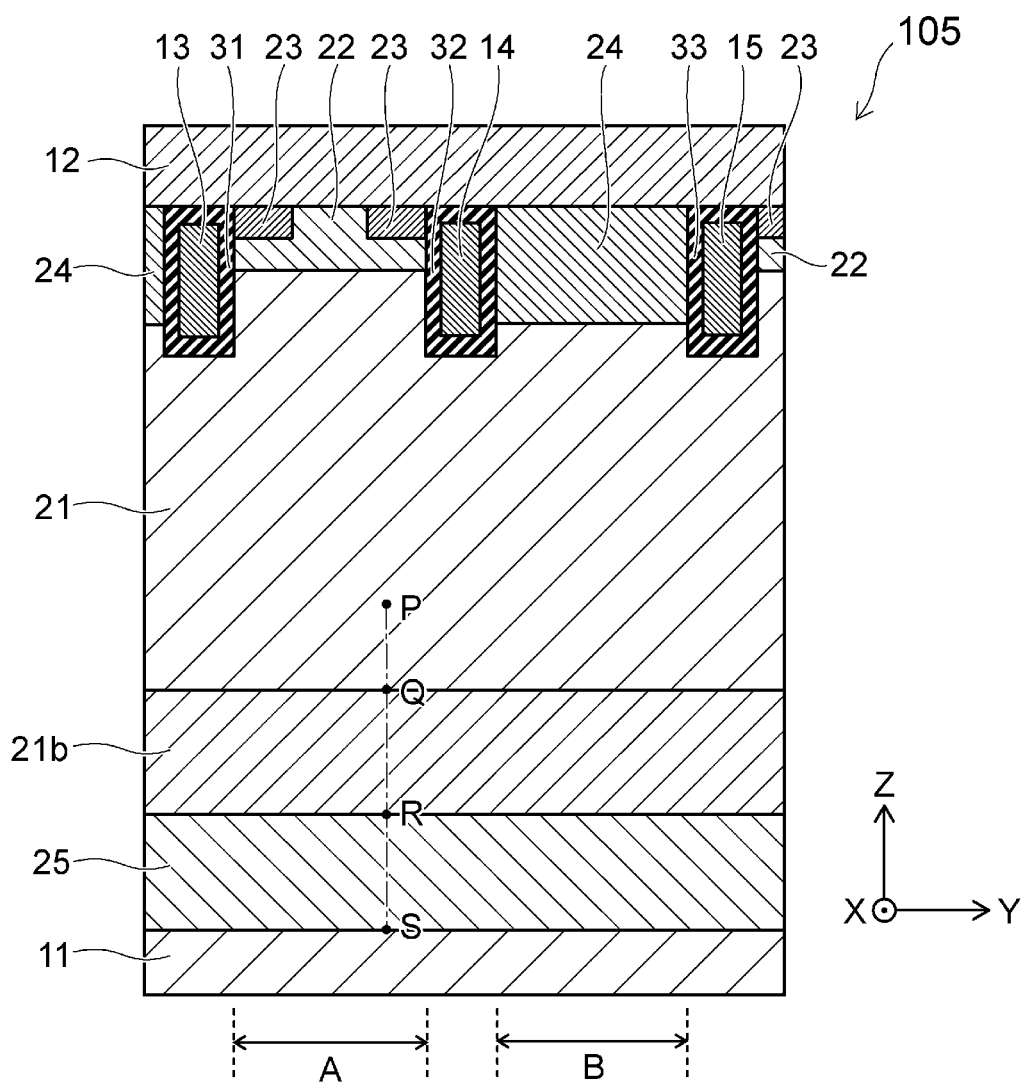
FIG. 7A is a schematic sectional view illustrating a semiconductor device according to some embodiments.
Figure 7B:
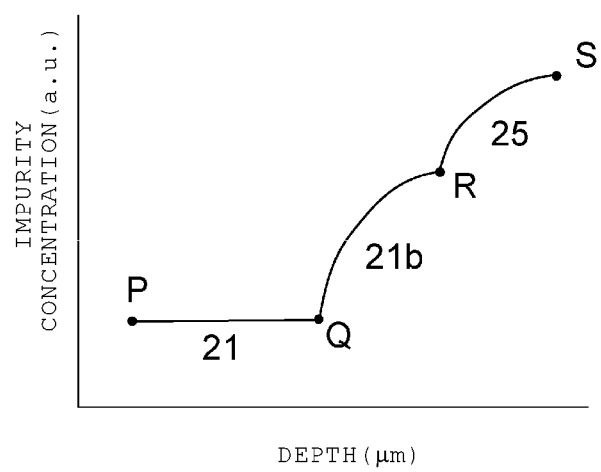
FIG. 7B is a graph illustrating an impurity concentration profile of a partial region of the semiconductor device according to some embodiments.

FIG. 7A is a schematic sectional view illustrating a semiconductor device according to some embodiments. FIG. 7B is a graph illustrating an impurity concentration profile of a partial region of the semiconductor device according to some embodiments. In FIG. 7B, a horizontal axis denotes a position (a point P, a point Q, a point R, and a point S of FIG. 7A) in the Z axis direction, and a vertical axis denotes an impurity concentration (a unit is an arbitrary value (a.u.)) and the level of a relative impurity concentration.

In some embodiments, in a semiconductor device 105, the $n^-$ type base region 21 has a region where an impurity concentration increases as it approaches the collector electrode 11. For example, this region is defined as an n-type buffer region 21b. In some embodiments, the n-type buffer region 21b has a predetermined thickness in the Z axis direction. In some embodiments, the n-type buffer region 21b extends in the X axis direction and the Y axis direction. In some embodiments, an impurity concentration of the n-type buffer region 21b is higher than that of the n⁻ type base region 21 except for the n-type buffer region 21b.

In some embodiments, the n-type buffer region 21b is provided in the n⁻ type base region 21, so that the thickness of the n⁻ type base region 21 in the Z axis direction becomes thin (compared to a configuration that is free of the n-type buffer region 21b) and its resistance is further lowered. In this way, in the semiconductor device 105, an on voltage in an ON state may be further reduced.

Figure 8A:
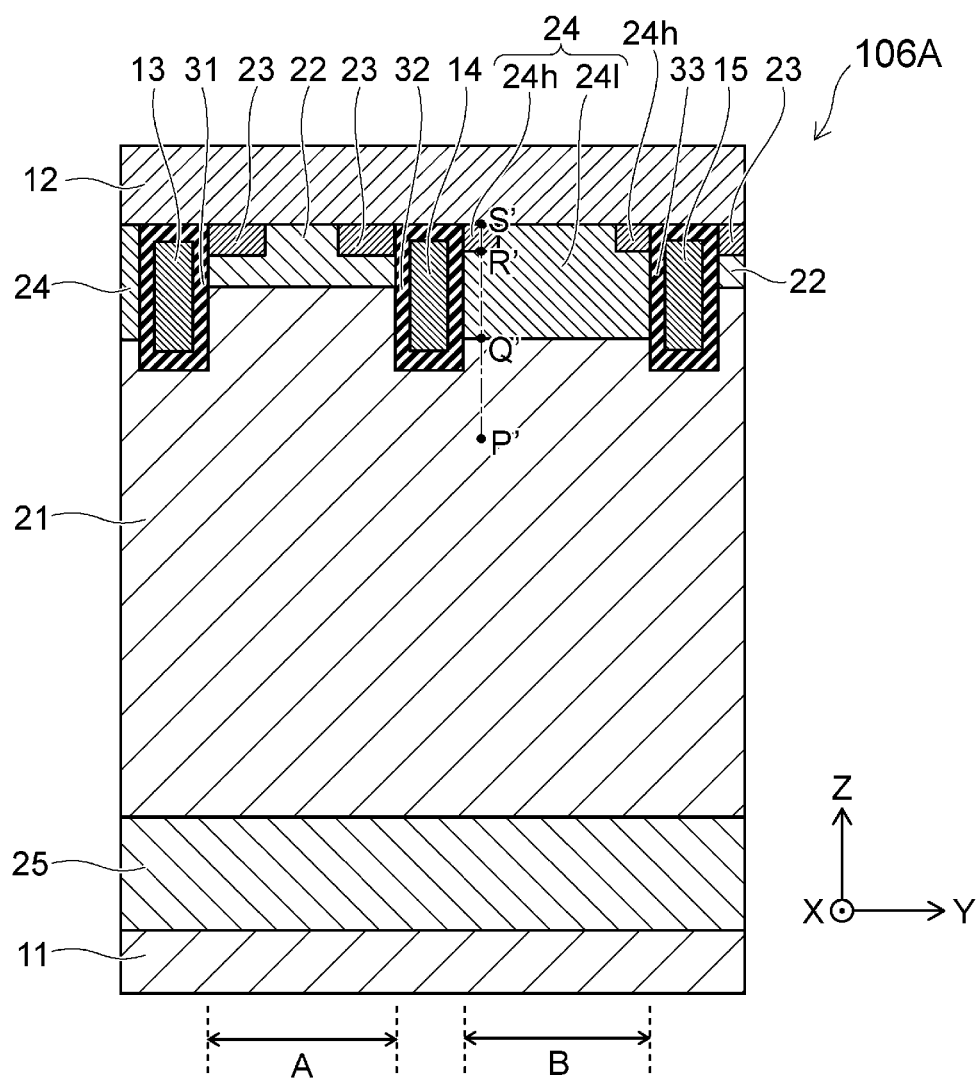
FIG. 8A is a schematic sectional view illustrating a semiconductor device according to some embodiments.
Figure 8B:
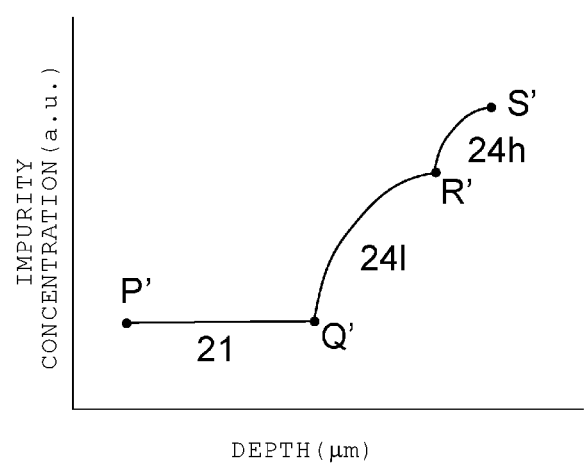
FIG. 8B is a graph illustrating an impurity concentration profile of a partial region of the semiconductor device according to some embodiments.

FIG. 8A is a schematic sectional view illustrating a semiconductor device according to some embodiments. FIG. 8B is a graph illustrating an impurity concentration profile of a partial region of the semiconductor device according to some embodiments. In FIG. 8B, a horizontal axis denotes a position (a point P', a point Q', a point R', and a point S' of FIG. 8A) in the Z axis direction, and a vertical axis denotes an impurity concentration (a unit is an arbitrary value (a.u.)) and the level of a relative impurity concentration.

In some embodiments, in a semiconductor device 106A, the p-type semiconductor region 24 includes a first region (a p-type semiconductor region 24l) and a second region (a p⁺ type semiconductor region 24h). In some embodiments, the p-type semiconductor region 24l and the p⁺ type semiconductor region 24h are electrically connected to the emitter electrode 12. In some embodiments, an impurity concentration of the p⁺ type semiconductor region 24h may be higher than that of the p-type semiconductor region 24l. For example, in the p⁺ type semiconductor region 24h, the impurity concentration increases as it approaches the emitter electrode 12.

In some embodiments, the p⁺ type semiconductor region 24h is provided between the emitter electrode 12 and the p-type semiconductor region 24l in the Z axis direction. In some embodiments, the p⁺ type semiconductor region 24h is selectively provided on the p-type semiconductor region 24l. In some embodiments, the p⁺ type semiconductor region 24h has a predetermined thickness in the Z axis direction. In some embodiments, the p⁺ type semiconductor region 24h extends in the X axis direction. In some embodiments, the p⁺ type semiconductor region 24h is in contact with the second insulating film 32 and the third insulating film 33.

In some embodiments, the high concentration p⁺ type semiconductor region 24h of the ohmic contact to the emitter electrode 12 may be provided in the p-type semiconductor region 24, so that a contact between the p-type semiconductor region 24 and the emitter electrode 12 may be a Schottky contact and the impurity concentration of the p-type semiconductor region 24 can be further lowered. In some embodiments, the impurity concentration of the p-type semiconductor region 24, for example, is equal to or less than $5 \times 10^{17}$ (atoms/cm³). In this way, during turning off, holes can be easily and quickly discharged by the emitter electrode 12 from the low resistance p-type semiconductor region 24l via the p⁺ type semiconductor region 24h. During turn-off switching, since there is a barrier of holes from the p-type semiconductor region 24l of the Schottky contact to the emitter electrode 12, a hole current may be difficult to flow. However, the high concentration p⁺ type semiconductor region 24h exists in the p-type semiconductor region 24, so that the hole current can become easily flowing from the low resistance p-type semiconductor region 24l to the emitter electrode 12 via the p⁺ type semiconductor region 24h. In this way, in the semiconductor device 106A, switching loss during turning off can be further reduced.

Furthermore, in some embodiments, during turning off, when a negative potential is applied to the fourth electrode 14 and the fifth electrode 15, an induction layer (a layer where a hole concentration is high) may be formed in the p-type semiconductor region 24l along the second insulating film 32 and the third insulating film 33. The induction layer may be a low resistance layer for holes. In this way, during turning off, holes can be quickly discharged to the emitter electrode 12 via the induction layer and the p⁺ type semiconductor region 24h.

Hereinafter, other examples of the p⁺ type semiconductor region 24h will be described.

Figure 9A:
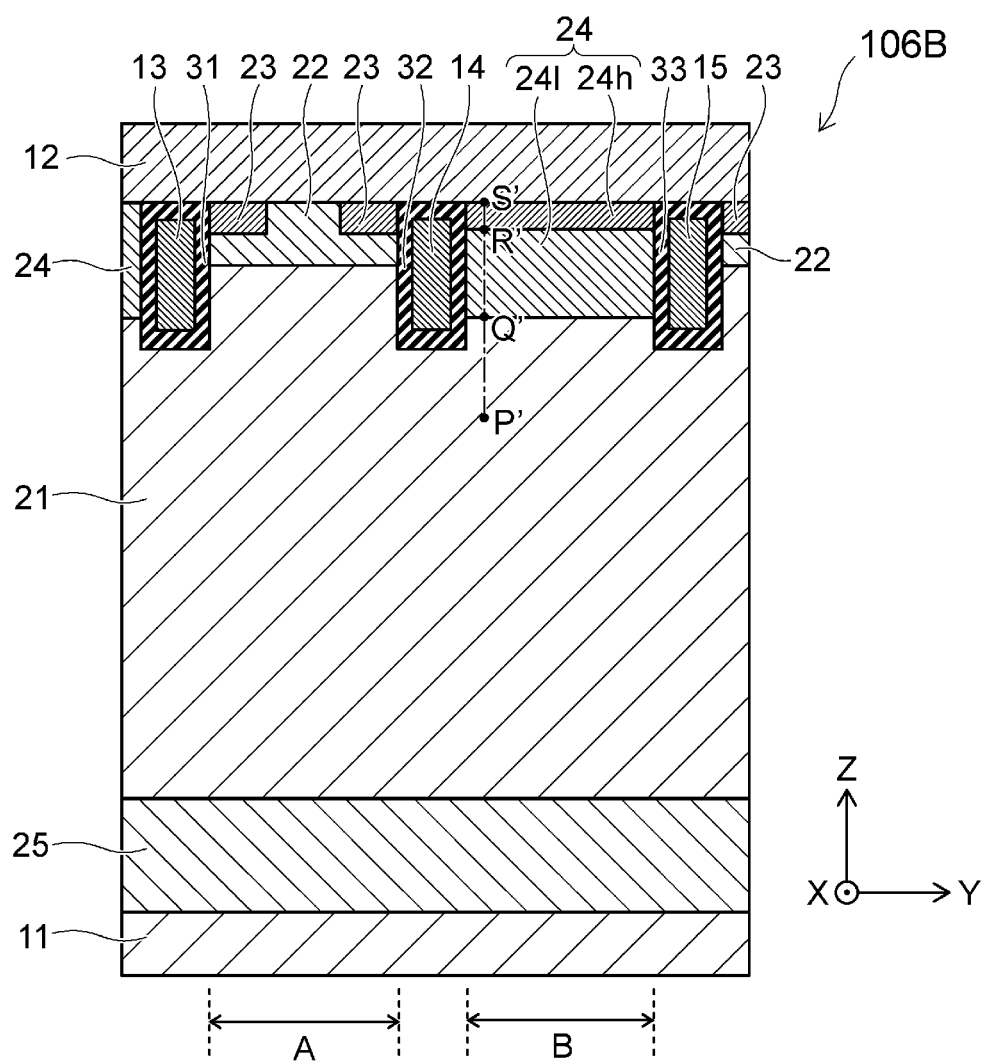
FIG. 9A is a schematic sectional view illustrating a semiconductor device according to some embodiments.
Figure 9B:
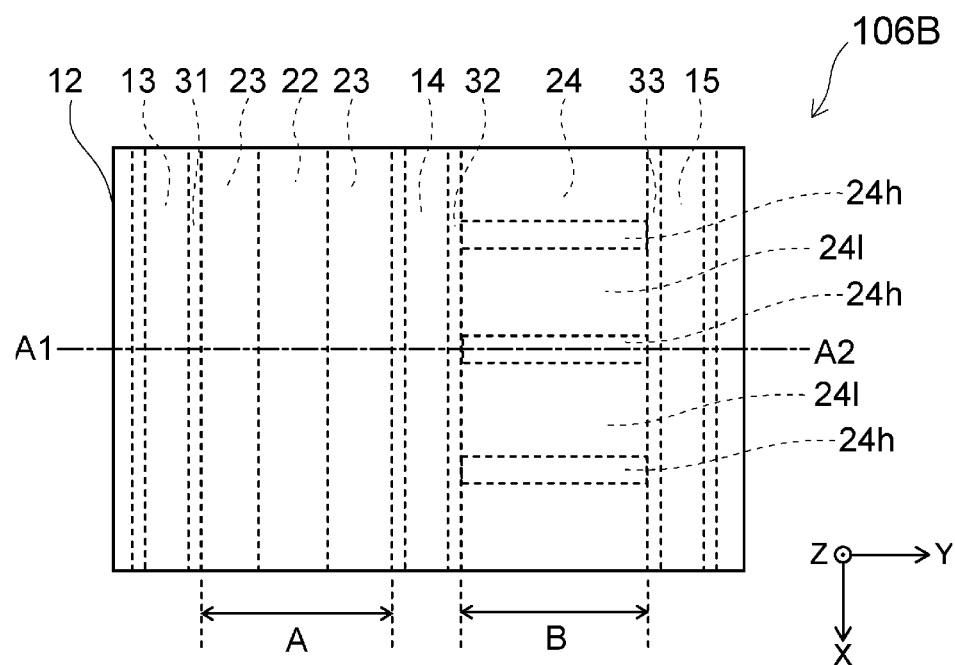
FIG. 9B is a schematic plan view illustrating the semiconductor device according to some embodiments.

FIG. 9A is a schematic sectional view illustrating a semiconductor device according to some embodiments. FIG. 9B is a schematic plan view illustrating the semiconductor device according to some embodiments. FIG. 9A illustrates a section taken along line A1-A2 of FIG. 9B.

In some embodiments, in a semiconductor device 106B illustrated in FIGS. 9A and 9B, the p⁺ type semiconductor region 24h extends in the Y axis direction between the p-type semiconductor region 24l and the emitter electrode 12. In some embodiments, the p⁺ type semiconductor region 24h is in contact with the second insulating film 32, and the third insulating film 33. Moreover, in some embodiments, the p⁺ type semiconductor region 24h is provided as a plurality of regions and is disposed in the X axis direction.

Figure 10A:
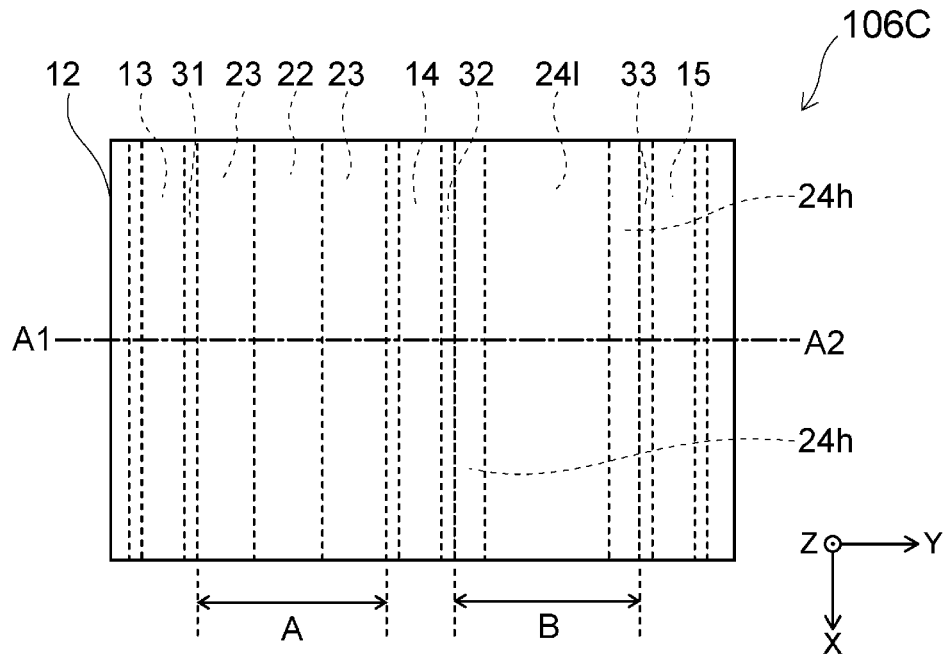
FIG. 10A is a schematic plan view illustrating a semiconductor device according to some embodiments.
Figure 10B:
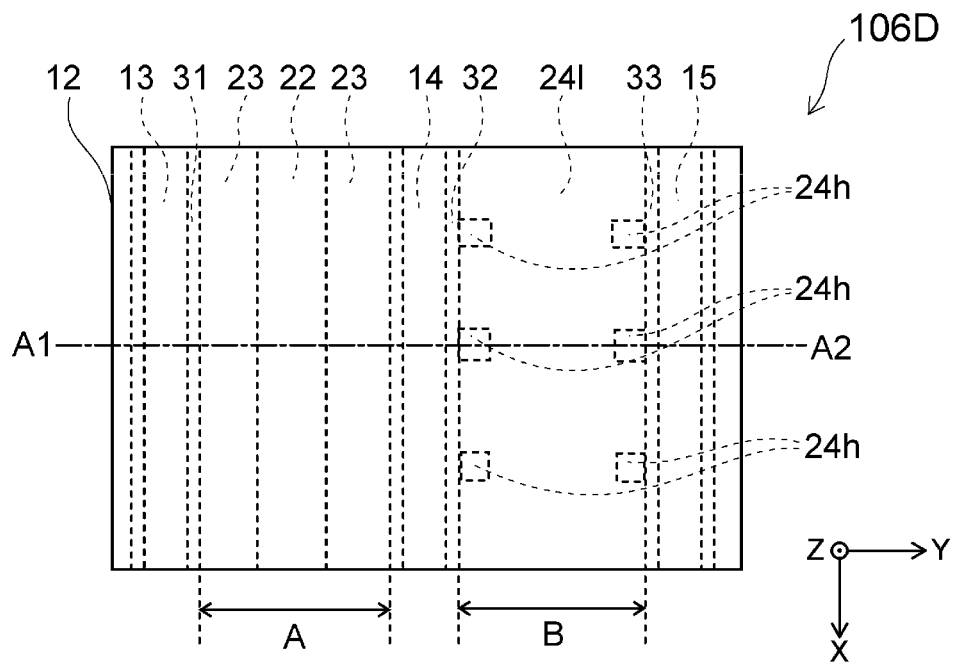
FIG. 10B is a schematic plan view illustrating a semiconductor device according to some embodiments.

FIG. 10A is a schematic plan view illustrating a semiconductor device according to some embodiments. FIG. 10B is a schematic plan view illustrating a semiconductor device according to some embodiments.

In some embodiments, in a semiconductor device 106C illustrated in FIG. 10A, the p⁺ type semiconductor region 24h extends in the X axis direction. In some embodiments, in a semiconductor device 106D illustrated in FIG. 10B, the p⁺ type semiconductor region 24h is provided as a plurality of regions and is disposed in the X axis direction. In some embodiments, in the semiconductor devices 106C and 106D, the p⁺ type semiconductor region 24h is interrupted (or disconnected) on the way of the Y axis direction.

Figure 11A:
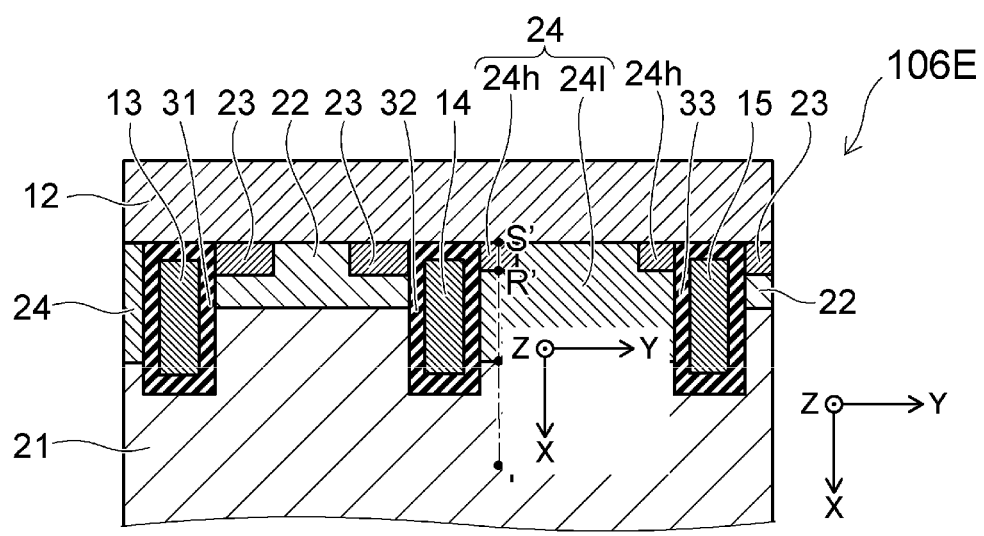
FIG. 11A and FIG. 11B are schematic sectional views illustrating a semiconductor device according to some embodiments.
Figure 11B:
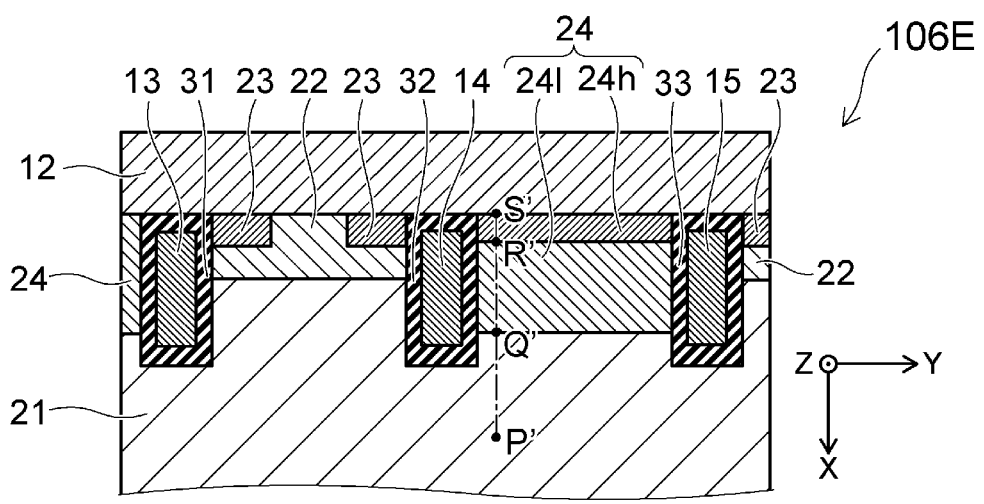
Figure 11C:
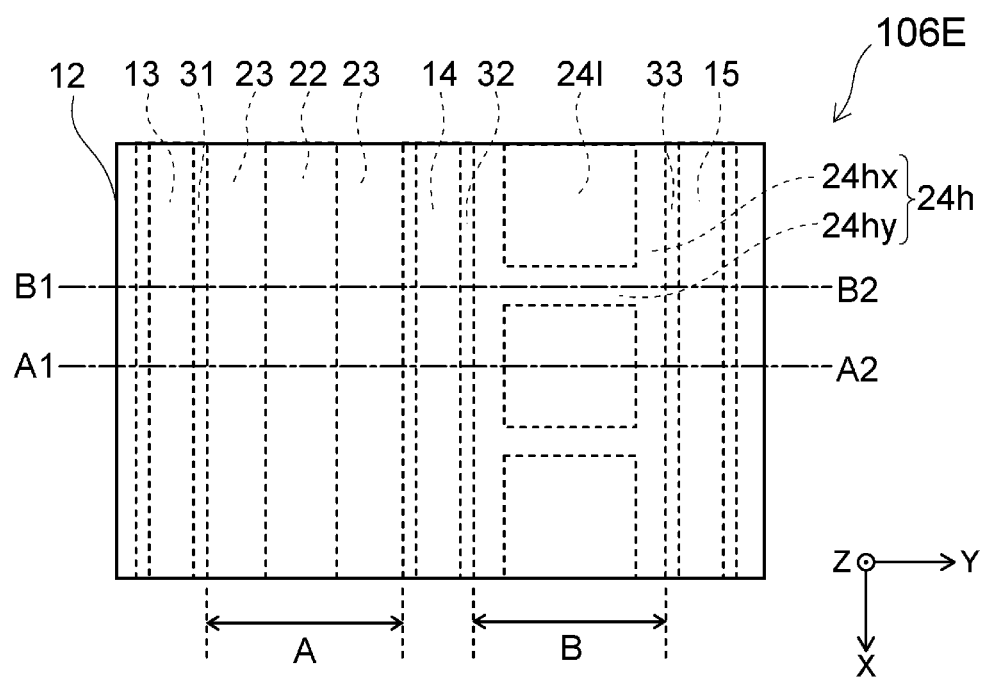
FIG. 11C is a schematic plan view illustrating the semiconductor device according to some embodiments.

FIGS. 11A and 11B are schematic sectional views illustrating a semiconductor device according to some embodiments. FIG. 11C is a schematic plan view illustrating the semiconductor device according to some embodiments. FIG. 11A illustrates a section taken along line A1-A2 of FIG. 11C. FIG. 11B illustrates a section taken along line B1-B2 of FIG. 11C. In FIGS. 11A and 11B, the p⁺ type collector region 25 and the collector electrode 11 are not illustrated.

In some embodiments, in a semiconductor device 106E illustrated in FIGS. 11A to 11C, the p⁺ type semiconductor region 24h includes a region 24hx (see FIG. 11C) extending in the X axis direction and a region 24hy (see FIG. 11C) extending in the Y axis direction. In some embodiments, the region 24hx is connected to the region 24hy. In some embodiments, the region 24hy is provided as a plurality of regions and is disposed in the X axis direction.

Figure 12A:
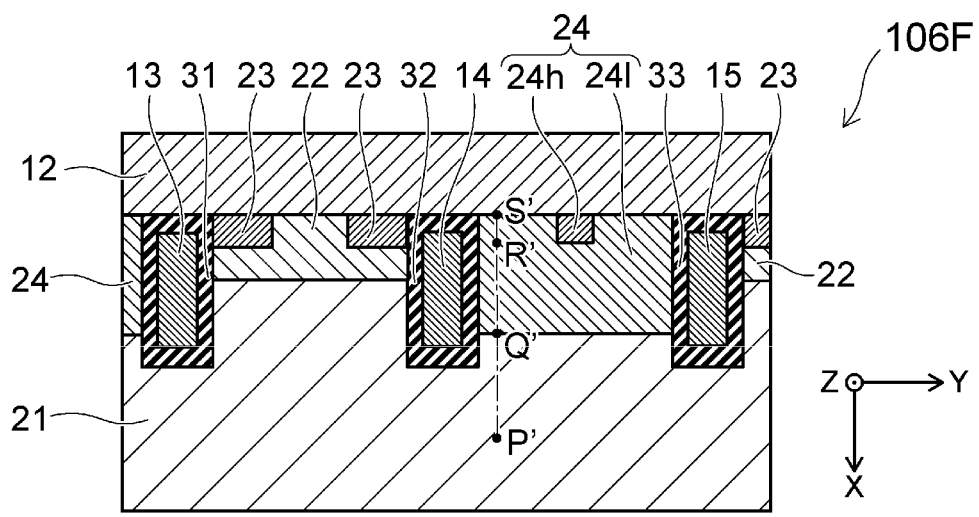
FIG. 12A and FIG. 12B are schematic sectional views illustrating a semiconductor device according to some embodiments.
Figure 12B:
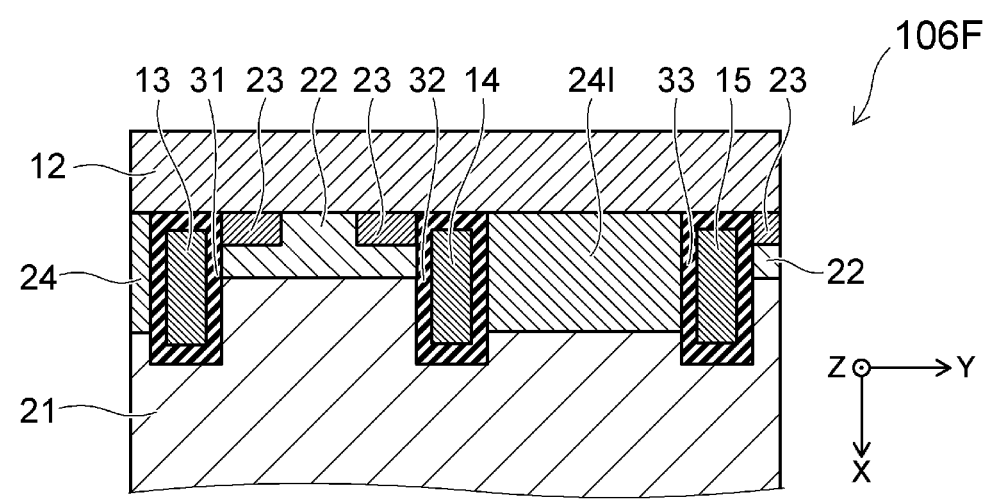
Figure 12C:
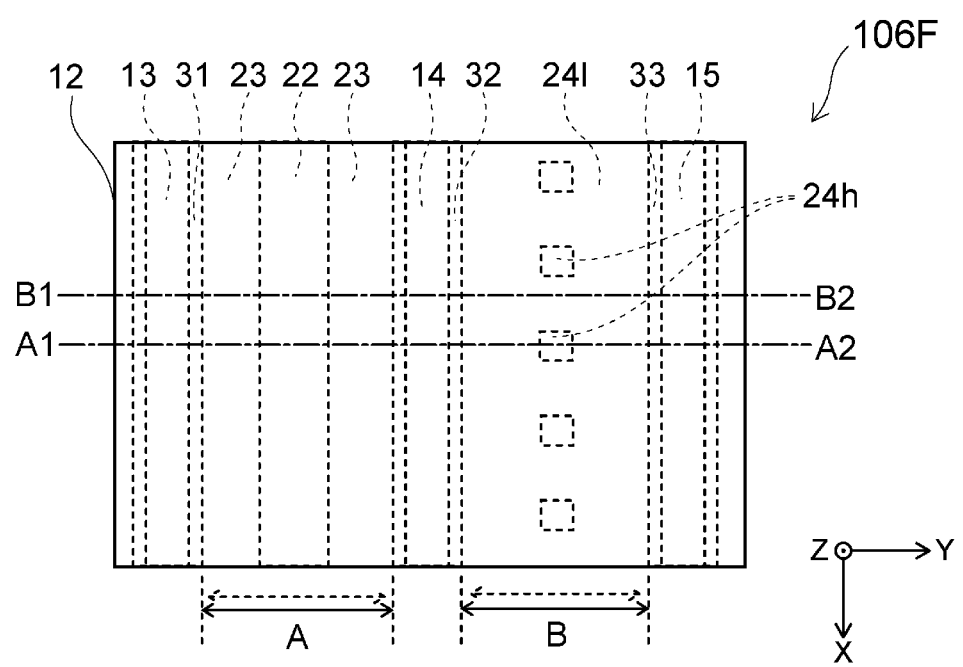
FIG. 12C is a schematic plan view illustrating the semiconductor device according to some embodiments.

FIGS. 12A and 12B are schematic sectional views illustrating a semiconductor device according to some embodiments. FIG. 12C is a schematic plan view illustrating a semiconductor device according to some embodiments. FIG. 12A illustrates a section taken along line A1-A2 of FIG. 12C. FIG. 12B illustrates a section taken along line B1-B2 of FIG. 12C.

In some embodiments, in a semiconductor device 106F illustrated in FIGS. 12A to 12C, the p-type semiconductor region 24*l* is provided between the p$^+$ type semiconductor region 24*h* and the second insulating film 32, and between the p$^+$ type semiconductor region 24*h* and the third insulating film 33 in the Y axis direction. In some embodiments, the p$^+$ type semiconductor region 24*h* is provided as a plurality of regions and is disposed in the X axis direction (see FIG. 12C).

In some embodiments, in the p$^+$ type semiconductor region 24*h* illustrated in FIGS. 9A to 12C, holes can be quickly discharged to the emitter electrode 12 from the low resistance p-type semiconductor region 24*l* via the p$^+$ type semiconductor region 24*h* during turning off. In this way, also in the semiconductor devices 106B to 106F, switching loss during turning off can be further reduced.

Figure 13A:
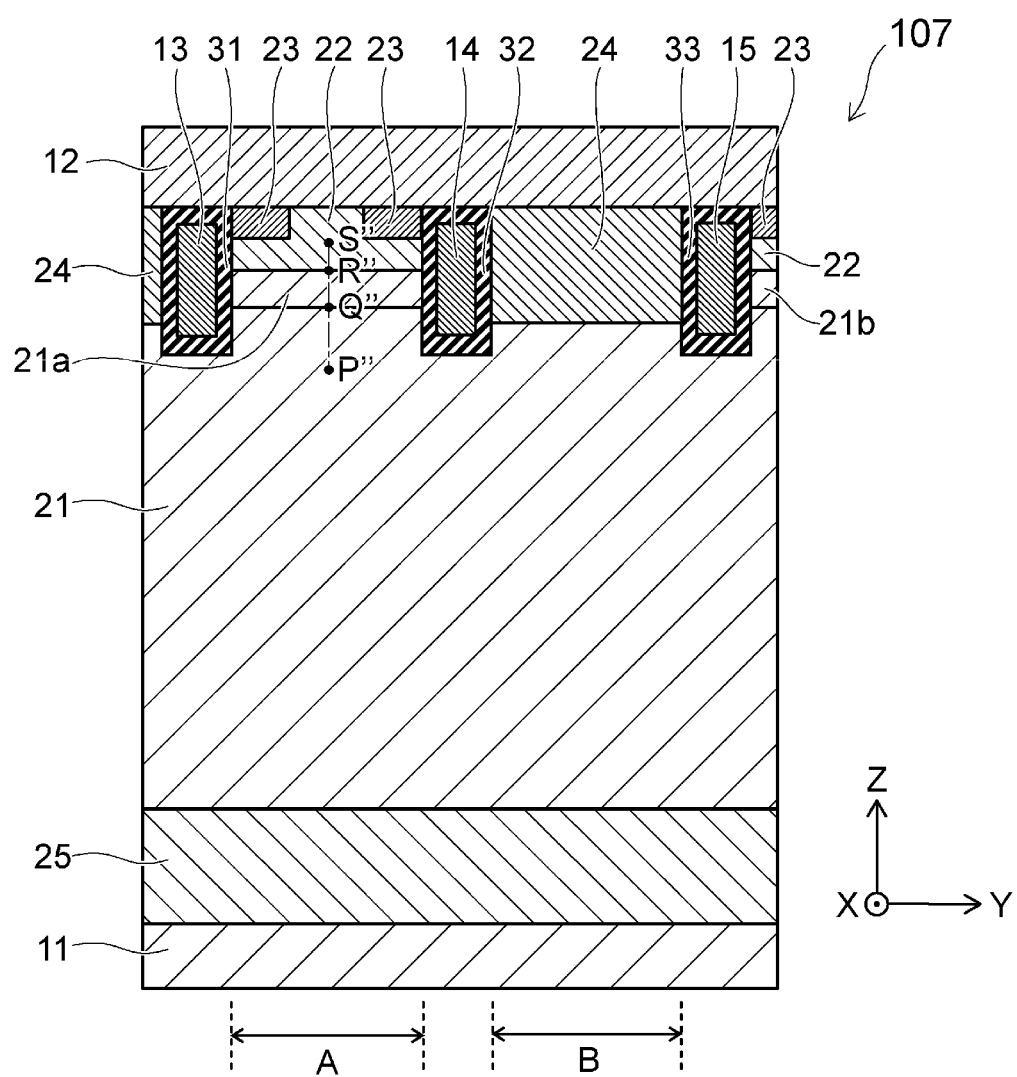
FIG. 13A is a schematic sectional view illustrating a semiconductor device according to some embodiments.
Figure 13B:
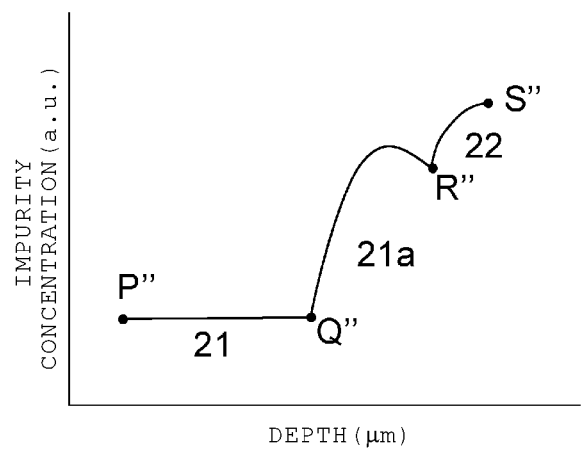
FIG. 13B is a graph illustrating an impurity concentration profile of a partial region of the semiconductor device according to some embodiments.

FIG. 13A is a schematic sectional view illustrating a semiconductor device according to some embodiments. FIG. 13B is a graph illustrating an impurity concentration profile of a partial region of the semiconductor device according to some embodiments. In FIG. 13B, a horizontal axis denotes a position (a point P″, a point Q″, a point R″, and a point S″ of FIG. 13A) in the Z axis direction, and a vertical axis denotes an impurity concentration (a unit is an arbitrary value (a.u.)) and the level of a relative impurity concentration.

In some embodiments, a semiconductor device 107 includes the elements of the semiconductor device 101. Moreover, in some embodiments, the semiconductor device 107 includes an n-type barrier region 21*a*. In some embodiments, the n-type barrier region 21*a* is provided between the n$^-$ type base region 21 and the p-type base region 22. In some embodiments, the n-type barrier region 21*a* is in contact with the n$^-$ type base region 21 and the p-type base region 22. In some embodiments, the n-type barrier region 21*a* is provided between the third electrode 13 and the fourth electrode 14. In some embodiments, the n-type barrier region 21*a* is in contact with the first insulating film 31 and the second insulating film 32. In some embodiments, the n-type barrier region 21*a* has a predetermined thickness in the Z axis direction. In some embodiments, the n-type barrier region 21*a* extends in the X axis direction. An impurity concentration of the n-type barrier region 21*a*, for example, is equal to or more than $1 \times 10^{15}$ (atoms/cm$^3$) and is equal to or less than $1 \times 10^{17}$ (atoms/cm$^3$).

In some embodiments, a conductivity type of the n-type barrier region 21*a* is identical with that of the n$^-$ type base region 21. In some embodiments, when the n-type barrier region 21*a* is employed as a part of the n$^-$ type base region 21, an impurity concentration profile of then type base region 21 in the Z axis direction may have a local maximum value between the third electrode 13 and the fourth electrode 14. For example, a peak of the impurity concentration in the Z axis direction is about $5 \times 10^{16}$ (atoms/cm$^3$). In some embodiments, the impurity concentration profile of the n-type barrier region 21*a* may be set to be high toward the emitter electrode 12.

In some embodiments, in the Z axis direction, a distance between the p-type semiconductor region 24 and the collector electrode 11 may be shorter than that between the p-type base region 22 and the collector electrode 11. In some embodiments, a thickness of the p-type semiconductor region 24 in the Z axis direction may be thicker than that of the p-type base region 22 in the Z axis direction.

FIGS. 14A and 14B are schematic sectional views illustrating an operation of the semiconductor device according to some embodiments. FIGS. 14A and 14B illustrate an operation of only a region between the third electrode 13 and the fifth electrode 15 as an example. In the following description, a description of an operation overlapping the operation of the semiconductor device 101 will be appropriately omitted.

FIG. 14A illustrates a state after turning on.

For example, in an ON state, an electron current e1 injected from the n$^+$ type emitter region 23 of the left side and an electron current e2 injected from the n$^+$ type emitter region 23 of the right side may reach the p$^+$ type collector region 25 below the n$^+$ type emitter regions 23. On the other hand, hole currents h1 and h2 injected from the p$^+$ type collector region 25 may be directed to the emitter side.

The hole current h1 injected from the p$^+$ type collector region 25 below the p-type base region 22 may flow to the emitter electrode 12 via the n$^-$ type base region 21 below the p-type base region 22, and the p-type base region 22.

In the n$^-$ type base region 21 below the p-type base region 22, many electrons may be injected. In this way, in the ON state, resistance of the n$^-$ type base region 21 below the p-type base region 22 may be lower than that of the n$^-$ type base region 21 below the p-type semiconductor region 24.

In this way, the hole current h2 injected from the p$^+$ type collector region 25 below the p-type semiconductor region 24 can easily flow to the n$^-$ type base region 21 below the p-type base region 22 having a relatively low resistance. As a consequence, a hole current h2*a* flowing to the p-type base region 22 can become larger than a hole current h2*b* flowing to the p-type semiconductor region 24. In other words, the hole current h1 and the hole current h2*a*, which is the majority of the hole current h2, can be concentrated on the n$^-$ type base region 21 below the p-type base region 22.

In some embodiments, in the semiconductor device 107, the n-type barrier region 21*a* is provided under the p-type base region 22. In some embodiments, the impurity concentration of the n-type barrier region 21*a* may be higher than that of the n$^-$ type base region 21. In some embodiments, the n-type barrier region 21*a* serves as a potential barrier for holes. In this way, in the semiconductor device 107, an electron injection amount from the emitter side can further increase. That is, for the holes, the energy barrier of a pn junction formed by the p-type base region 22 and the n-type barrier region 21*a* can be higher than that of a pn junction formed by the p-type base region 22 and the n$^-$ type base region 21. In this way, in the semiconductor device 107, carriers can more easily stay below the p-type base region 22, so that the IE effect is promoted as compared with the semiconductor device 101. As a consequence, in the semiconductor device 107, on resistance in the ON state can be further reduced, so that an on voltage can be lowered.

FIG. 14B illustrates a state during turning off. During turning off, holes remaining in the n$^-$ type base region 21 may be discharged to the emitter electrode 12 via the p-type base region 22 and the p-type semiconductor region 24. For the holes, the potential barrier of the p-type semiconductor region 24 may be lower than that of the p-type base region 22 between a pair of n$^+$ type emitter regions 23. Furthermore, the holes can easily flow to the emitter electrode 12 via the p-type semiconductor region 24, as compared with the case of flowing to the emitter electrode 12 via the p-type base region 22. In this way, a current formed by holes h4 can become larger than that formed by holes h3.

In some embodiments, in the semiconductor device 107, the p-type semiconductor region 24 is provided additionally to the p-type base region 22, and during turning off, holes can be quickly discharged to the emitter electrode 12 via the p-type base region 22 and the p-type semiconductor region 24. In this way, during turning off, electrons remaining in the n⁻ type base region 21 can be quickly discharged to the collector electrode 11. In this way, in the semiconductor device 107, switching loss during turning off can be reduced.

As described above, in the semiconductor device 107, an on voltage is reduced and switching loss during turning off can be reduced.

Figure 15:
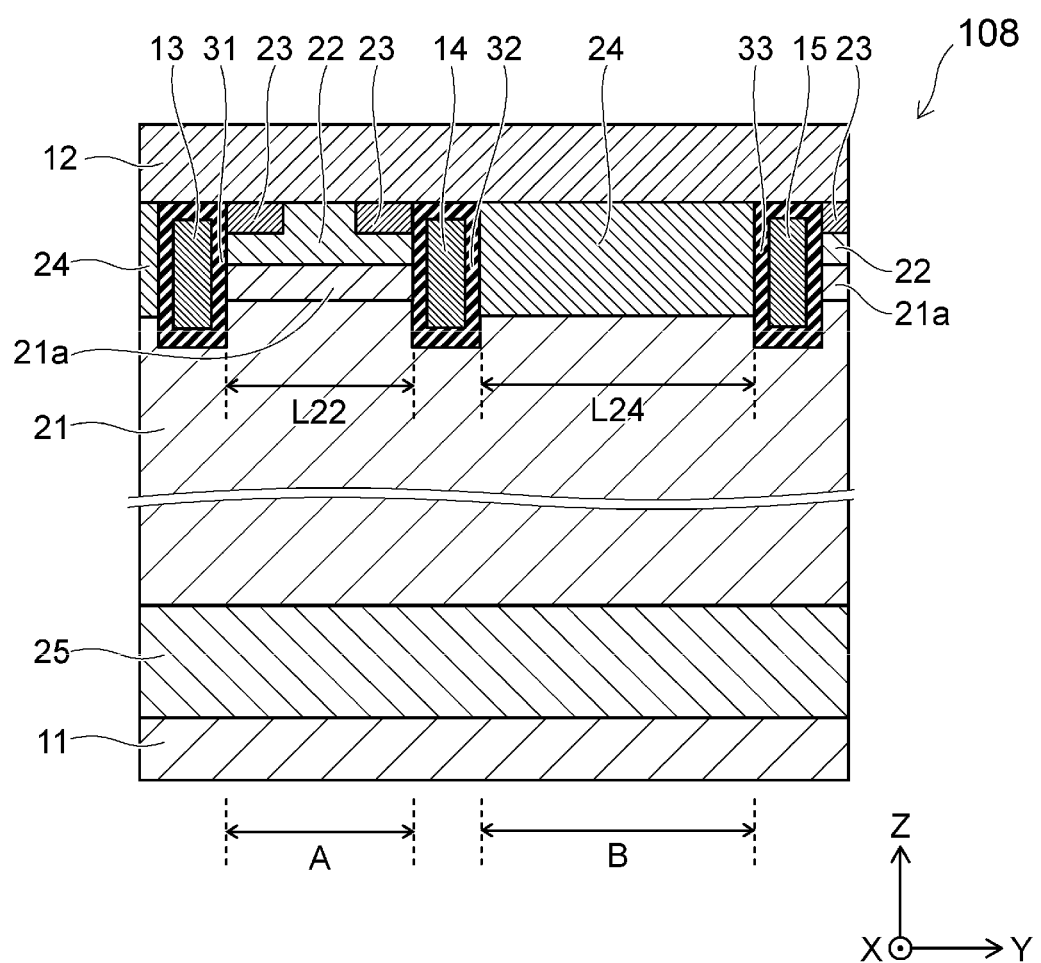
FIG. 15 is a schematic sectional view illustrating a semiconductor device according to some embodiments.

FIG. 15 is a schematic sectional view illustrating a semiconductor device according to some embodiments.

In some embodiments, a semiconductor device 108 includes the elements of the semiconductor device 107. In some embodiments, in the semiconductor device 108, in the Y axis direction, a length L24 of the p-type semiconductor region 24 is longer than a length L22 of the p-type base region 22.

In this way, during turning off, holes can be easily and quickly discharged by the emitter electrode 12 via the wide p-type semiconductor region 24. In this way, in the semiconductor device 108, switching loss during turning off can be further reduced as compared with the semiconductor device 107.

Figure 16A:
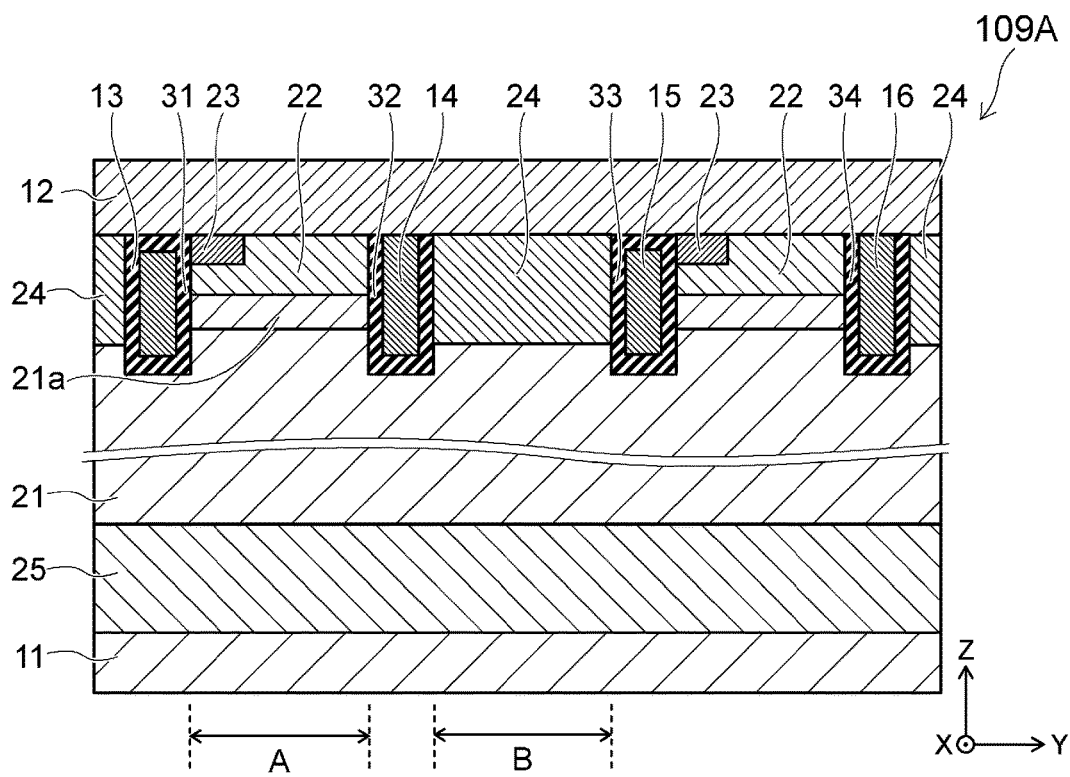
FIG. 16A is a schematic sectional view illustrating a semiconductor device according to some embodiments.
Figure 16B:
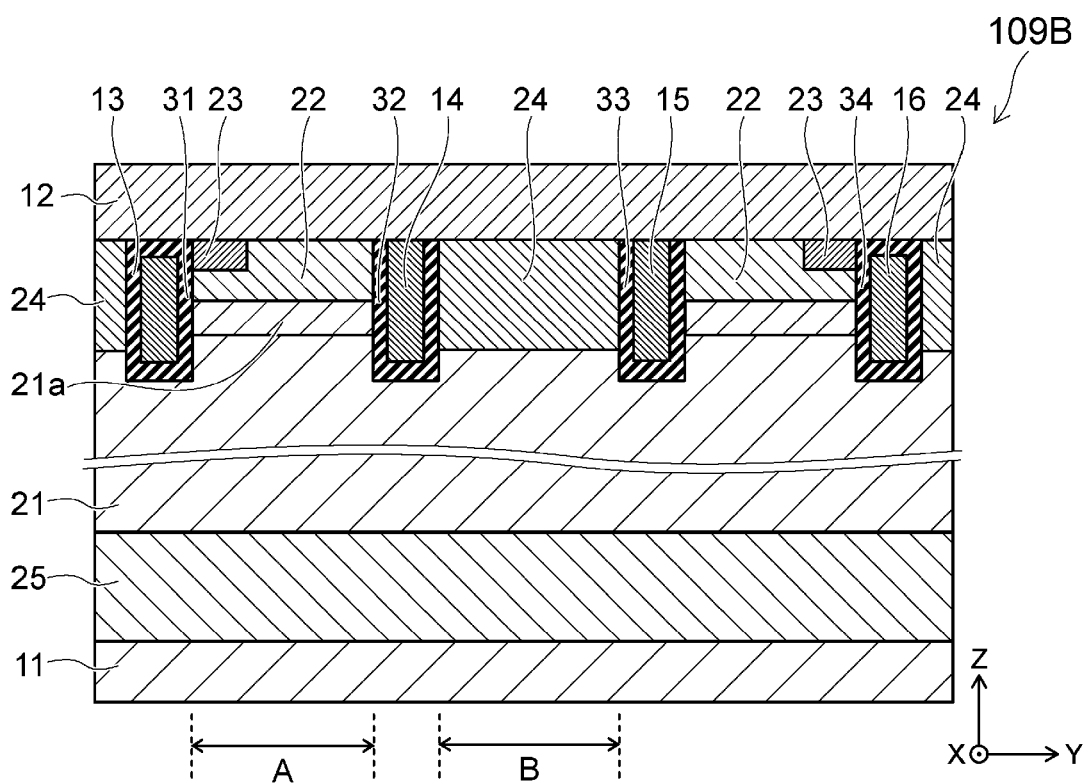
FIG. 16B is a schematic sectional view illustrating a semiconductor device according to some embodiments.

FIG. 16A is a schematic sectional view illustrating a semiconductor device according to some embodiments. FIG. 16B is a schematic sectional view illustrating a semiconductor device according to some embodiments.

In some embodiments, a semiconductor device 109A illustrated in FIG. 16A includes the n-type barrier region 21a under the p-type base region 22. In some embodiments, the n⁺ type emitter region 23 is provided to the third electrode 13 side and is not provided to the fourth electrode 14 side. In some embodiments, the fourth electrode 14 is electrically connected to the emitter electrode 12. In some embodiments, the n⁺ type emitter region 23 provided to the p-type base region 22 is in contact with the third insulating film 33 and is not provided to the fourth insulating film 34 side.

In some embodiments, a semiconductor device 109B illustrated in FIG. 16B includes the n-type barrier region 21a under the p-type base region 22. In some embodiments, each of the fourth electrode 14 and the fifth electrode 15 is electrically connected to the emitter electrode 12. In some embodiments, the n⁺ type emitter region 23 is in contact with the fourth insulating film 34.

In some embodiments, the structure in which an insulating film is interposed between the n⁺ type emitter region 23 and the gate electrode is reduced, so that a parasitic capacitance Cge between the gate electrode and the emitter electrode is reduced. In this way, current loss of gate drives for controlling the potentials of the gate electrodes of the semiconductor devices 109A and 109B can be reduced. Moreover, switching operations of the semiconductor devices 109A and 109B can become more fast.

Figure 17:
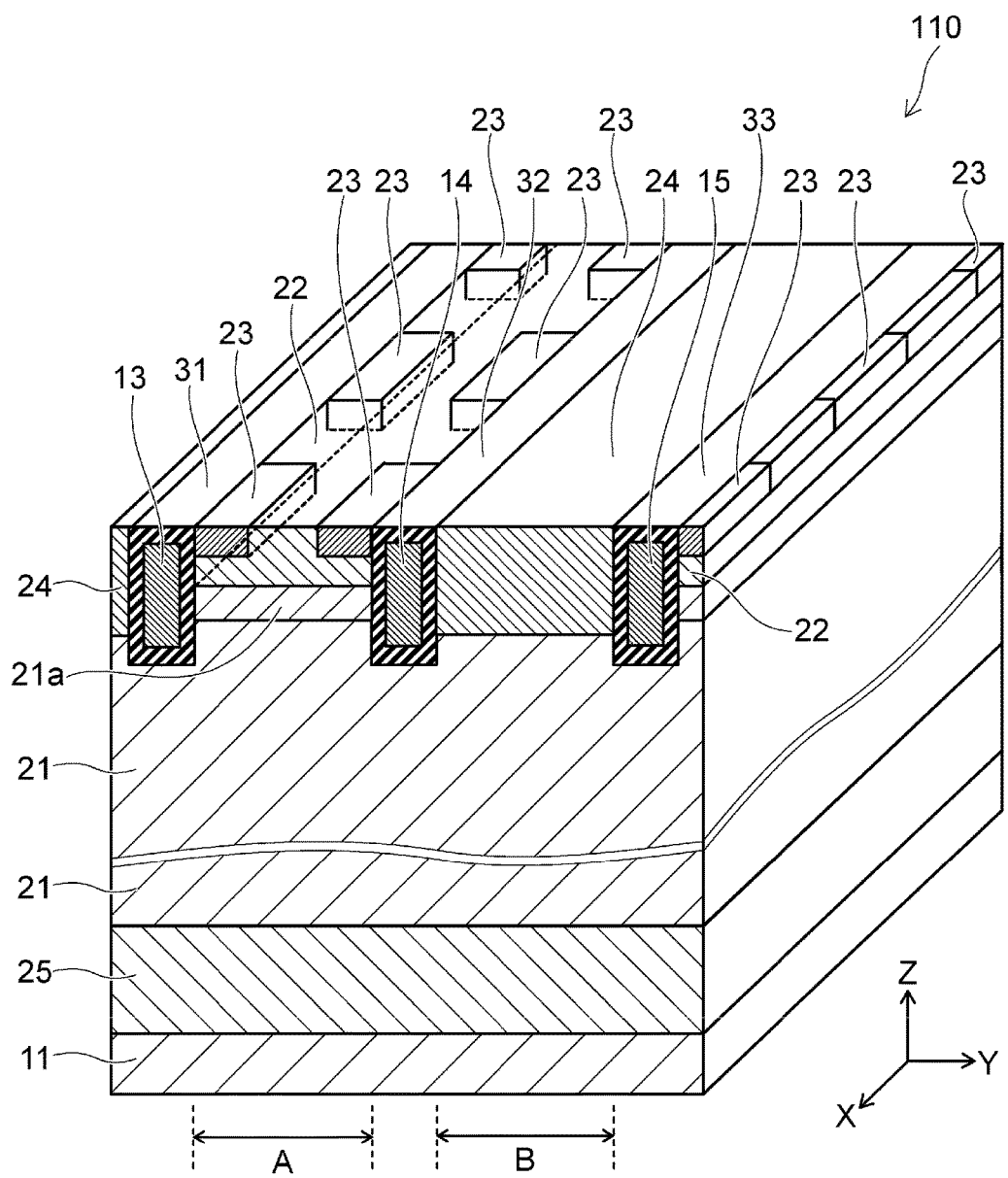
FIG. 17 is a schematic perspective view illustrating a semiconductor device according to some embodiments.

FIG. 17 is a schematic perspective view illustrating a semiconductor device according to some embodiments. In FIG. 17, the emitter electrode 12 is not illustrated.

In some embodiments, a semiconductor device 110 includes the elements of the semiconductor device 107. In some embodiments, the n⁺ type emitter region 23 is divided in the X axis direction. For example, the n⁺ type emitter region 23 includes a plurality of regions. The plurality of regions, for example, are periodically disposed in the X axis direction.

In this way, a value (a channel width W/a channel length L) obtained by the channel width W by the channel length L is further reduced. A length of the n⁺ type emitter region 23 in the X axis direction is defined as the channel width W (not shown) and a depth of the n⁺ type emitter region 23 in the Z axis direction is defined as the channel length L (not shown). In this way, in the semiconductor device 110, it is possible to suppress a saturation current on an ON state.

Figure 18:
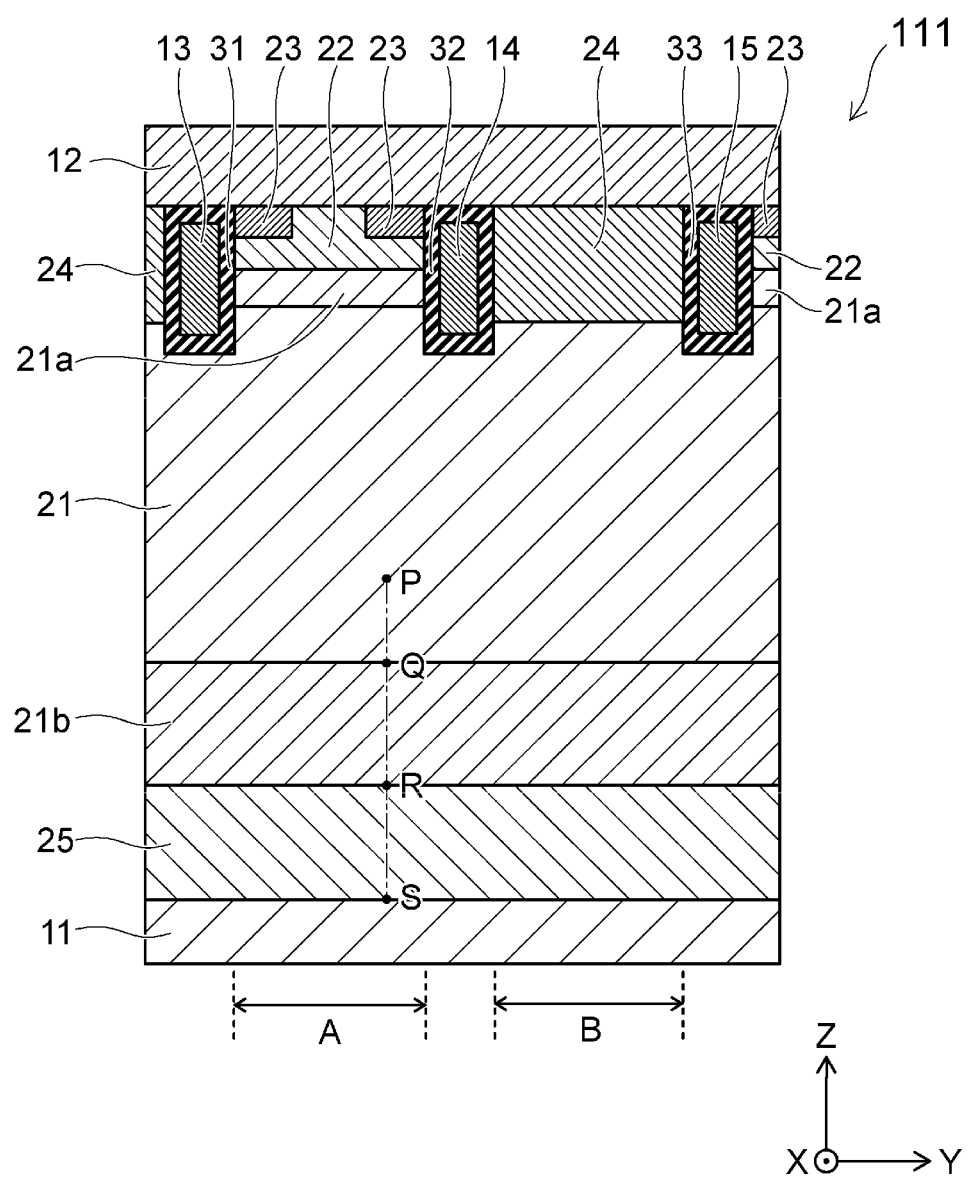
FIG. 18 is a schematic sectional view illustrating a semiconductor device according to some embodiments.

FIG. 18 is a schematic sectional view illustrating a semiconductor device according to some embodiments.

An impurity concentration profile from a point P to a point S in the Z axis direction, for example, is identical with that illustrated in FIG. 7B.

In some embodiments, a semiconductor device 111 includes the elements of the semiconductor device 107. In some embodiments, in the semiconductor device 111, the n⁻ type base region 21 has the n-type buffer region 21a where an impurity concentration increase as it approaches the collector electrode 11.

In some embodiments, the n-type buffer region 21a is provided in the n⁻ type base region 21, so that the thickness of the n⁻ type base region 21 in the Z axis direction can become thin (as compared with a configuration that is free of the n-type buffer region 21a) and its resistance is further lowered. In this way, in the semiconductor device 111, an on voltage in an ON state can be further reduced.

Figure 19:
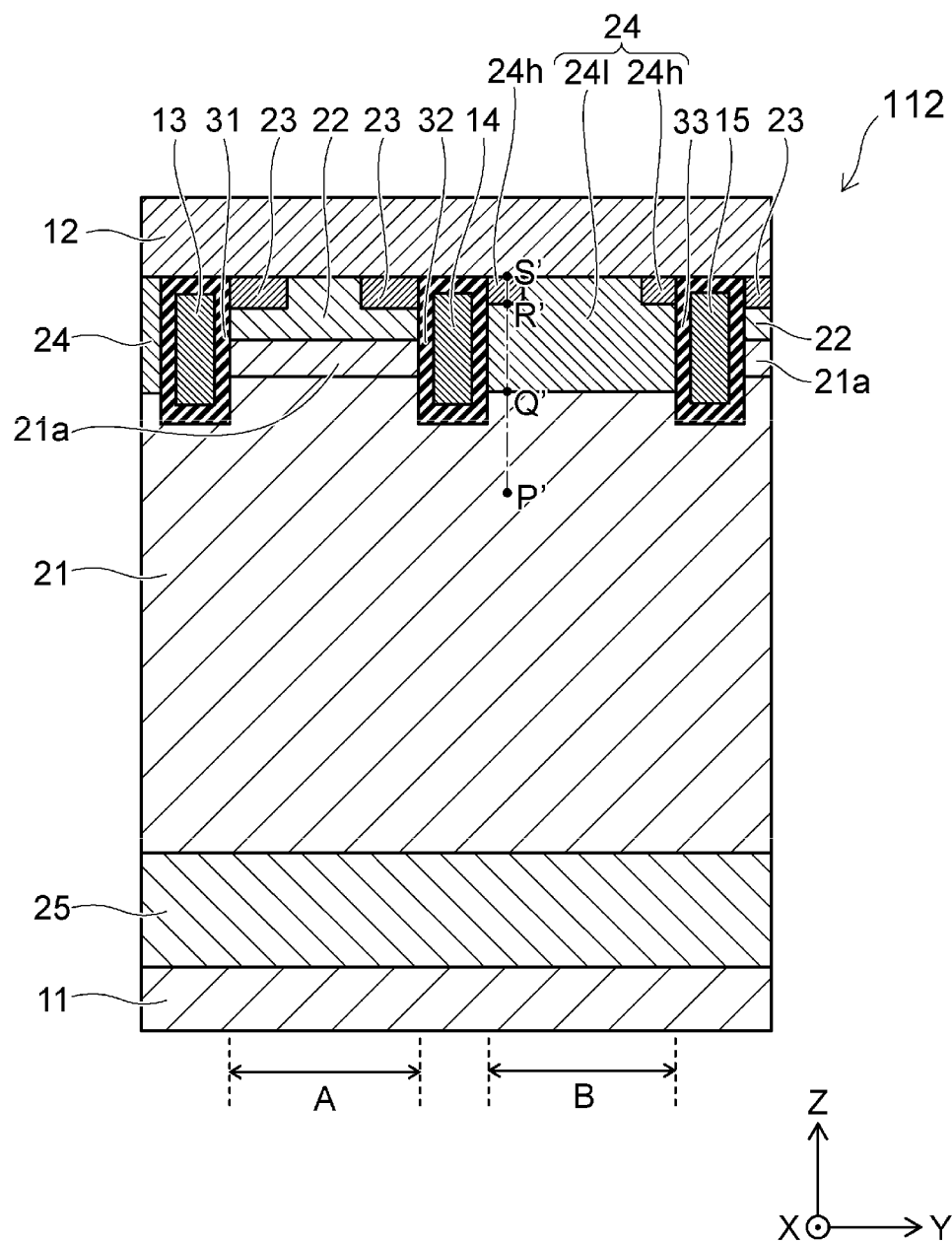
FIG. 19 is a schematic sectional view illustrating a semiconductor device according to some embodiments.

FIG. 19 is a schematic sectional view illustrating a semiconductor device according to some embodiments.

An impurity concentration profile from a point P' to a point S' in the Z axis direction, for example, is identical with that illustrated in FIG. 12B.

In some embodiments, a semiconductor device 112 includes the elements of the semiconductor device 107. In some embodiments, in the semiconductor device 112, the p-type semiconductor region 24 has the p⁺ type semiconductor region 24h.

In some embodiments, the p-type semiconductor region 24 is provided with the high concentration p⁺ type semiconductor region 24h that makes an ohmic contact with the emitter electrode 12, so that it is possible to further lower an impurity concentration of the p-type semiconductor region 24 even though a contact between the p-type semiconductor region 24 and the emitter electrode 12 is a Schottky contact. In some embodiments, the impurity concentration of the p-type semiconductor region 24, for example, is equal to or less than $5 \times 10^{17}$ (atoms/cm³). Resistance of the p-type semiconductor region 24 can be further lowered. In this way, during turning off, holes can be easily and quickly discharged by the emitter electrode 12 from the low resistance p-type semiconductor region 24l via the p⁺ type semiconductor region 24h. In this way, in the semiconductor device 112, switching loss during turning off can be further reduced.

In some embodiments, during turning off, when a negative potential is applied to the fourth electrode 14 and the fifth electrode 15, an induction layer where a hole concentration is high may be formed in the p-type semiconductor region 24l along the second insulating film 32 and the third insulating film 33. In this way, during turning off, holes can be further quickly discharged to the emitter electrode 12 via the induction layer and the p⁺ type semiconductor region 24h.

Figure 20A:
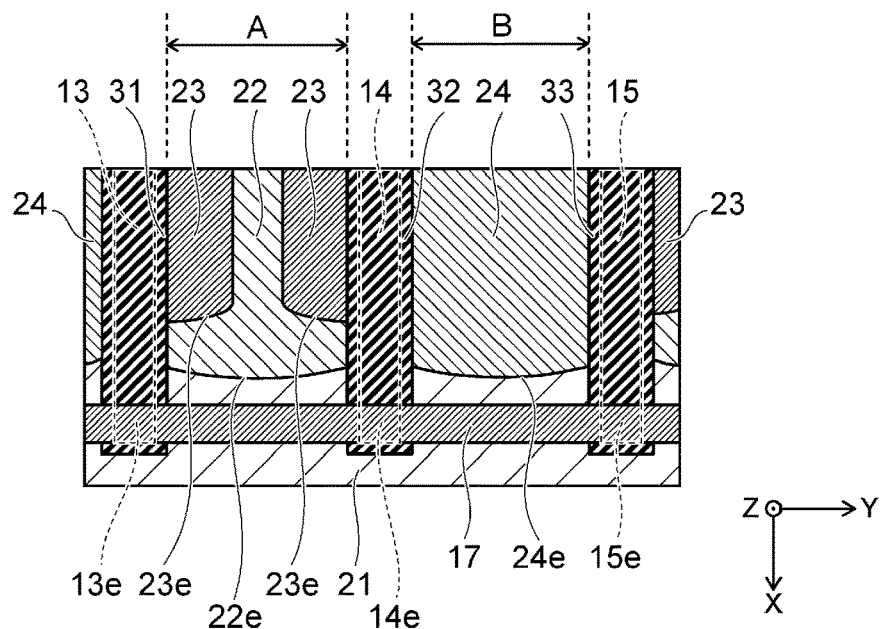
FIG. 20A and FIG. 20B are schematic sectional views illustrating a semiconductor device according to some embodiments.

FIGS. 20A to 2B are schematic sectional views illustrating a semiconductor device according to some embodiments.

FIGS. 20A to 21B, for example, illustrate the vicinity of end portions of the third electrode 13, the fourth electrode 14, and the fifth electrode 15 under the emitter electrode 12 of the semiconductor device 101.

In an example illustrated in FIG. 20A, a wiring 17 is provided on an end portion 13e of the third electrode 13, an end portion 14e of the fourth electrode 14, and an end portion 15e of the fifth electrode 15. In some embodiments, the wiring 17 is electrically connected to each of the third electrode 13, the fourth electrode 14, and the fifth electrode 15. For example, in the Z axis direction, the wiring 17 may be in contact with each of the third electrode 13, the fourth electrode 14, and the fifth electrode 15, or may be connected to each of the third electrode 13, the fourth electrode 14, and the fifth electrode 15 via a via electrode. The wiring 17 includes aluminum (Al), polysilicon and the like.

In some embodiments, an end portion 22e of the p-type base region 22 is provided between the third electrode 13 and the fourth electrode 14. In some embodiments, an end portion 24e of the p-type semiconductor region 24 is provided between the fourth electrode 14 and the fifth electrode 15. In some embodiments, an end portion 23e of the n$^+$ type emitter region 23 is positioned in the p-type base region 22. In some embodiments, the end portion 23e of the n$^+$ type emitter region 23 is provided between the third electrode 13 and the fourth electrode 14. In some embodiments, the end portion 13e of the third electrode 13 is in contact with the n$^-$ type base region 21 via the first insulating film 31, the end portion 14e of the fourth electrode 14 is in contact with the n$^-$ type base region 21 via the second insulating film 32, and the end portion 15e of the fifth electrode 15 is in contact with the n$^-$ type base region 21 via the third insulating film 33.

Figure 20B:
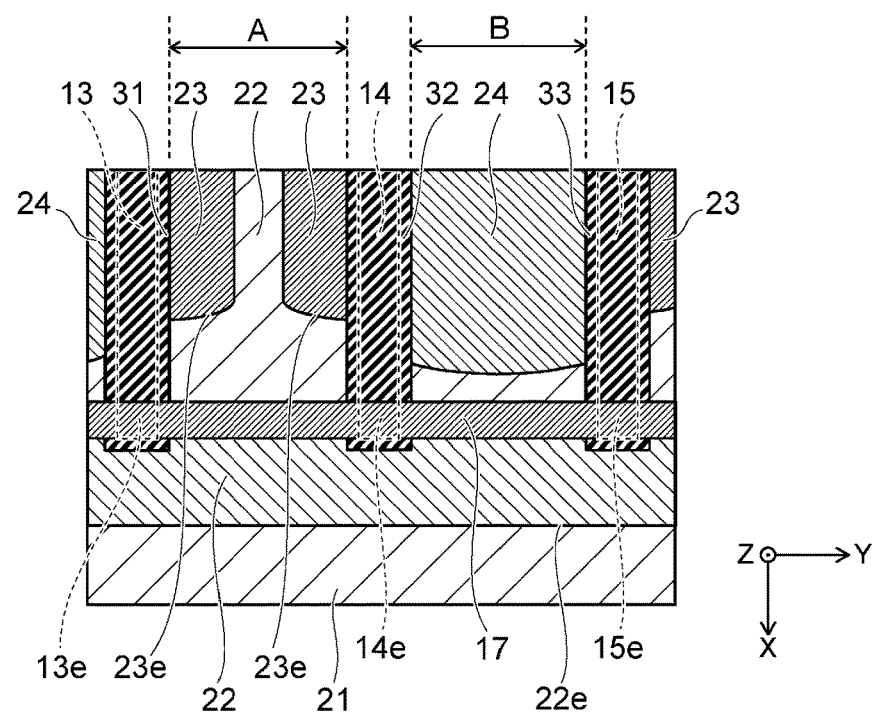

In an example illustrated in FIG. 20B, the end portion 24e of the p-type semiconductor region 24 is provided between the fourth electrode 14 and the fifth electrode 15. In some embodiments, the end portion 23e of the n$^+$ type emitter region 23 is positioned in the p-type base region 22. In some embodiments, the end portion 23e of the n$^+$ type emitter region 23 is provided between the third electrode 13 and the fourth electrode 14.

In some embodiments, the end portion 13e of the third electrode 13 is in contact with the p-type base region 22 via the first insulating film 31, the end portion 14e of the fourth electrode 14 is in contact with the p-type base region 22 via the second insulating film 32, and the end portion 15e of the fifth electrode 15 is in contact with the p-type base region 22 via the third insulating film 33 (see FIG. 20B). In some embodiments, the end portion 22e of the p-type base region 22 is positioned outside the end portions of the third electrode 13, the fourth electrode 14, and the fifth electrode 15 (see FIG. 20B).

Figure 21A:
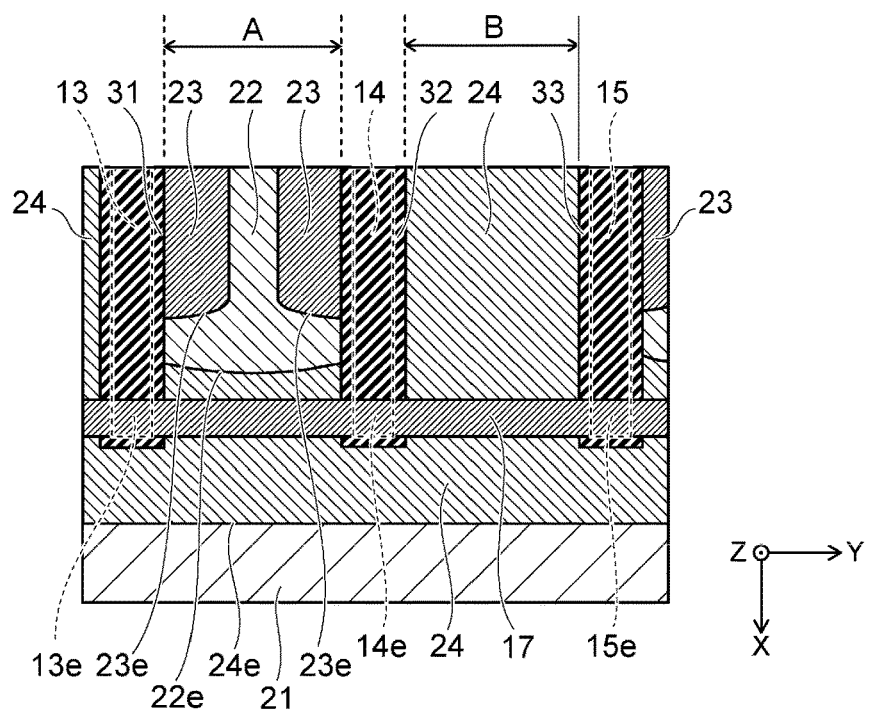
FIG. 21A and FIG. 21B are schematic sectional views illustrating a semiconductor device according to some embodiments.

In an example illustrated in FIG. 21A, the end portion 22e of the p-type base region 22 is provided between the third electrode 13 and the fourth electrode 14. In some embodiments, the end portion 23e of the n$^+$ type emitter region 23 is positioned in the p-type base region 22. In some embodiments, the end portion 23e of the n$^+$ type emitter region 23 is provided between the third electrode 13 and the fourth electrode 14.

In some embodiments, the end portion 13e of the third electrode 13 is in contact with the p-type semiconductor region 24 via the first insulating film 31, the end portion 14e of the fourth electrode 14 is in contact with the p-type semiconductor region 24 via the second insulating film 32, and the end portion 15e of the fifth electrode 15 is in contact with the p-type semiconductor region 24 via the third insulating film 33 (see FIG. 21A). In some embodiments, the end portion 24e of the p-type semiconductor region 24 is positioned outside the end portions of the third electrode 13, the fourth electrode 14, and the fifth electrode 15 (see FIG. 21A).

Figure 21B:
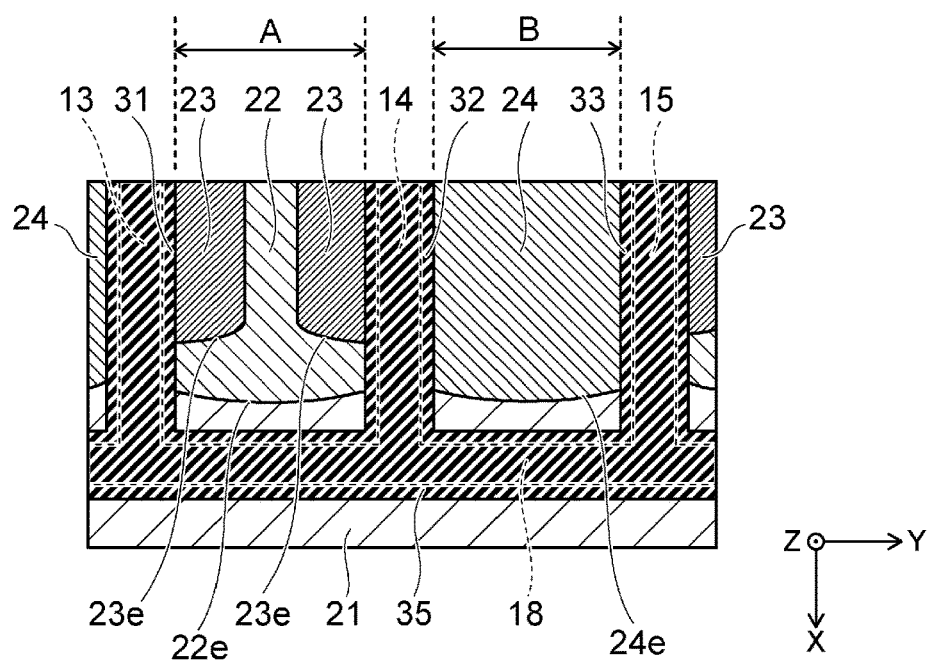

In an example illustrated in FIG. 21B, the third electrode 13, the fourth electrode 14, and the fifth electrode 15 are connected to an electrode 18. In some embodiments, the electrode 18, for example, includes the same material as that of the third electrode 13, the fourth electrode 14, and the fifth electrode 15. In some embodiments, the third electrode 13, the fourth electrode 14, the fifth electrode 15, and the electrode 18 are positioned at the same height from the collector electrode 11. In some embodiments, between the electrode 18 and the n$^-$ type base region 21, an insulating film 35 is provided.

For example, in the semiconductor device 101, the third electrode 13, the fourth electrode 14, and the fifth electrode 15 are a gate electrode (see FIG. 21B). In some embodiments, when the third electrode 13, the fourth electrode 14, the fifth electrode 15, and the electrode 18 are integrally defined as a gate electrode, the third electrode 13 may be read as a first part of the gate electrode, the fourth electrode 14 may be read as a second part of the gate electrode, and the fifth electrode 15 may be read as a third part of the gate electrode (see FIG. 21B).

In the embodiments illustrated in FIGS. 1A to 19, sections in a part of the semiconductor devices or plans thereof are illustrated. For example, even though the third electrode 13, the fourth electrode 14, and the fifth electrode 15 are connected to the electrode 18 to integrally form an electrode, individual electrodes illustrated in partial sections are defined as the third electrode 13, the fourth electrode 14, and the fifth electrode 15.

In some embodiments, as illustrated in FIGS. 20A to 21B, the termination structures of the p-type base region 22, the n$^+$ type emitter region 23, the p-type semiconductor region 24, the third electrode 13, the fourth electrode 14, and the fifth electrode 15 are also applied to the embodiments illustrated in FIGS. 4 to 19.

In the present disclosure, the "A is provided on B" includes a case in which A and B are reversed and A is positioned below B, and a case in which A and B are transversely disposed. This is because, even though the semiconductor devices according to some embodiments are rotated, there is no change in the structures of the semiconductor devices before and after the rotation.

So far, the embodiments have been described byway of specified examples. However, the embodiments are not limited to these specified examples. That is, examples obtained by adding appropriate design modifications to these specified examples by a person skilled in the art are included in the scope of the embodiments as long as these specified examples have characteristics of the embodiments. Each element included in the aforementioned each specified example and the arrangement, material, condition, shape, size and the like thereof are not limited to the exemplification and can be appropriately modified.

Furthermore, each element included in the aforementioned each embodiment can be combined as long as technically feasible, and combinations thereof are also included in the scope of the embodiments as long as including characteristics of the embodiments. In addition, within the spirit of the embodiments, a person skilled in the art can arrived at various modifications and corrections and it is understood that these modifications and corrections are included in the scope of the embodiments.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising: a first electrode; a second electrode; a first semiconductor region of a first conductivity type that is provided between the first electrode and the second electrode; a third electrode that is provided between the first semiconductor region and the second electrode; a fourth electrode that is provided between the first semiconductor region and the second electrode and is aligned with the third electrode in a second direction intersecting a first direction toward the second electrode from the first electrode; a fifth electrode that is provided between the first semiconductor region and the second electrode and is aligned with the fourth electrode in the second direction, the fifth electrode provided at an opposite side to the third electrode, and is in contact with the second electrode; a second semiconductor region of a second conductivity type that is provided between the first semiconductor region and the second electrode and between the third electrode and the fourth electrode, and is electrically connected to the second electrode; a third semiconductor region of the first conductivity type that is provided between the second semiconductor region and the second electrode and is electrically connected to the second electrode; a fourth semiconductor region of the second conductivity type that is provided between the first semiconductor region and the second electrode to be electrically connected to the second electrode, and is aligned with the second semiconductor region via the fourth electrode in the second direction; a first insulating film that is provided between (1) the third electrode and (2) the first semiconductor region, the second semiconductor region, the third semiconductor region, and the second electrode; a second insulating film that is provided between (1) the fourth electrode and (2) the first semiconductor region, the second semiconductor region, and the fourth semiconductor region; and a fifth semiconductor region of a second conductivity type that is provided between the first electrode and the first semiconductor region and is electrically connected to the first electrode, wherein an impurity concentration profile of the first semiconductor region in the first direction has a local maximum value between the third electrode and the fourth electrode and does not have the local maximum value between the fourth electrode and the fifth electrode.

2. The semiconductor device according to claim 1, wherein a distance between (1) an interface between the fourth semiconductor region and the first semiconductor region and (2) the first electrode is shorter than a distance between (3) an interface between the second semiconductor region and the first semiconductor region and (2) the first electrode.

3. The semiconductor device according to claim 1, further comprising:
a third insulating film,
wherein
the third insulating film is provided between (1) the fifth electrode and (2) the first semiconductor region and the fourth semiconductor region, and
the fourth semiconductor region is provided between the fourth electrode and the fifth electrode.

4. The semiconductor device according to claim 3, wherein the fourth electrode or the fifth electrode is electrically connected to the second electrode.

5. The semiconductor device according to claim 1, wherein, in the second direction, a length of the fourth semiconductor region is longer than a length of the second semiconductor region.

6. The semiconductor device according to claim 1, wherein the third semiconductor region is in contact with the first insulating film and does not contact with the second insulating film.

7. The semiconductor device according to claim 1, wherein the second insulating film is provided between the fourth electrode and the third semiconductor region.

8. The semiconductor device according to claim 1, wherein the third semiconductor region is provided as a plurality of regions disposed to be aligned in a third direction intersecting the first direction and the second direction.

9. The semiconductor device according to claim 1, wherein the first semiconductor region has a region where an impurity concentration increases toward the first electrode.

* * * * *